US010340433B2

(12) United States Patent
Lee et al.

(10) Patent No.: US 10,340,433 B2
(45) Date of Patent: Jul. 2, 2019

(54) LIGHT EMITTING DEVICE

(71) Applicant: LG INNOTEK CO., LTD., Seoul (KR)

(72) Inventors: Tae Sung Lee, Seoul (KR); Sung Min Kong, Seoul (KR); Young Min Ryu, Seoul (KR); Jae Hwan Jung, Seoul (KR); Jong Beom Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/544,495

(22) PCT Filed: Jan. 19, 2016

(86) PCT No.: PCT/KR2016/000554
§ 371 (c)(1),
(2) Date: Jul. 18, 2017

(87) PCT Pub. No.: WO2016/117910
PCT Pub. Date: Jul. 28, 2016

(65) Prior Publication Data
US 2018/0019386 A1    Jan. 18, 2018

(30) Foreign Application Priority Data
Jan. 19, 2015   (KR) .................. 10-2015-0008568

(51) Int. Cl.
H01L 33/48        (2010.01)
H01L 33/50        (2010.01)
(Continued)

(52) U.S. Cl.
CPC ........ H01L 33/647 (2013.01); H01L 25/0753 (2013.01); H01L 33/502 (2013.01);
(Continued)

(58) Field of Classification Search
CPC ... H01L 33/647; H01L 25/0753; H01L 33/56; H01L 33/502; H01L 33/60;
(Continued)

(56) References Cited

U.S. PATENT DOCUMENTS 7,821,194 B2   10/2010   Negley et al.
7,847,302 B2   12/2010   Basin et al.
(Continued)

FOREIGN PATENT DOCUMENTS

CN    102084509 A    6/2011
CN    102142507 A    8/2011
(Continued)

OTHER PUBLICATIONS

International Search Report, issued in PCT/KR2016/000554 (PCT/ISA/210), dated May 12, 2016.

Primary Examiner — Steven H Loke
Assistant Examiner — Juanita B Rhodes
(74) Attorney, Agent, or Firm — Birch, Stewart, Kolasch & Birch, LLP

(57) ABSTRACT

A light-emitting element disclosed in an embodiment comprises: a body having a cavity; first and second lead frames arranged in the cavity; a third lead frame arranged between the first and second lead frames in the cavity; a fourth lead frame arranged between the first and second lead frames and distanced from the third frame in the cavity; a first light-emitting chip arranged on the first lead frame; and a second light-emitting chip arranged on the second lead frame, wherein the body comprises: first and second sides arranged on opposing sides from each other; and third and fourth sides arranged on opposing sides from each other, the first lead frame comprises first and second lead parts protruding toward the first and second sides, the second lead frame comprises third and forth lead parts protruding toward the (Continued)

first and second sides, the third frame comprises a fifth lead part protruding toward the first side, and the fourth lead frame comprises a sixth lead part protruding toward the second side.

17 Claims, 9 Drawing Sheets

(51) Int. Cl.
    *H01L 33/56*     (2010.01)
    *H01L 33/60*     (2010.01)
    *H01L 33/62*     (2010.01)
    *H01L 33/64*     (2010.01)
    *H01L 25/075*     (2006.01)

(52) U.S. Cl.
    CPC .............. *H01L 33/56* (2013.01); *H01L 33/60* (2013.01); *H01L 33/486* (2013.01); *H01L 33/62* (2013.01); *H01L 2224/48091* (2013.01); *H01L 2224/48247* (2013.01); *H01L 2933/0033* (2013.01)

(58) Field of Classification Search
    CPC ........... H01L 2933/0033; H01L 33/486; H01L 2224/48247; H01L 2224/48091; H01L 33/62
    See application file for complete search history.

(56) References Cited

U.S. PATENT DOCUMENTS

| | | | |
|---|---|---|---|
| 8,123,376 | B2 | 2/2012 | Van De Ven et al. |
| 8,240,875 | B2 | 8/2012 | Roberts et al. |
| 10,147,857 | B2 | 12/2018 | Lee |
| 2007/0001187 | A1 | 1/2007 | Kim |
| 2008/0012125 | A1 | 1/2008 | Son |
| 2009/0303694 | A1 | 12/2009 | Roth et al. |
| 2010/0025700 | A1 | 2/2010 | Jung et al. |
| 2010/0155748 | A1* | 6/2010 | Chan ....................... H01L 33/63 257/89 |
| 2010/0219770 | A1 | 9/2010 | Kim et al. |
| 2011/0186875 | A1 | 8/2011 | Egoshi et al. |
| 2012/0104426 | A1 | 5/2012 | Chan et al. |
| 2012/0262941 | A1* | 10/2012 | Min .................... H01L 25/0753 257/88 |
| 2013/0027930 | A1 | 1/2013 | Kobayakawa et al. |
| 2013/0121000 | A1 | 5/2013 | Lee et al. |
| 2014/0167078 | A1 | 6/2014 | Jang et al. |

FOREIGN PATENT DOCUMENTS

| | | |
|---|---|---|
| CN | 102270630 A | 12/2011 |
| CN | 102856316 A | 1/2013 |
| CN | 102859730 A | 1/2013 |
| CN | 103190006 A | 7/2013 |
| CN | 103872030 A | 6/2014 |
| JP | 2011-233671 A | 11/2011 |
| JP | 2014-212347 A | 11/2014 |
| JP | 2014-236040 A | 12/2014 |
| KR | 10-0665216 B1 | 1/2007 |
| KR | 10-2007-0016240 A | 2/2007 |
| KR | 10-0818162 B1 | 3/2008 |
| KR | 10-0875443 B1 | 12/2008 |
| KR | 10-0924912 B1 | 11/2009 |
| KR | 10-0965120 B1 | 6/2010 |
| KR | 10-2010-0135496 A | 12/2010 |
| KR | 10-1104230 B1 | 1/2012 |
| KR | 10-1121731 B1 | 6/2012 |
| KR | 10-2013-0054040 A | 5/2013 |
| KR | 10-2013-0069211 A | 6/2013 |
| KR | 10-2013-0131814 A | 12/2013 |

\* cited by examiner

LIGHT EMITTING DEVICE

CROSS REFERENCE TO RELATED APPLICATIONS

This application is the National Phase of PCT International Application No. PCT/KR2016/000554, filed on Jan. 19, 2016, which claims priority under 35 U.S.C. 119(a) to Patent Application No. 10-2015-0008568, filed in the Republic of Korea on Jan. 19, 2015, all of which are hereby expressly incorporated by reference into the present application.

TECHNICAL FIELD

The present disclosure relates to a light emitting device and a lighting device including the same.

BACKGROUND ART

A light emitting device may have, for example, a light emitting diode. The light emitting diode, which is a kind of a semiconductor device for converting electrical energy into light, has been spotlighted as a next generation light source in substitution for a conventional fluorescent lamp and a glow lamp.

Since the light emitting diode generates the light by using the semiconductor device, the light emitting diode may represent significantly low power consumption as compared with the glow lamp that generates the light by heating tungsten or the fluorescent lamp that generates the light by urging ultraviolet ray, which is generated through the high-voltage discharge, to collide with a fluorescent substance.

In addition, since the light emitting diode generates the light by using the potential gap of the semiconductor device, the light emitting diode represents a longer lifespan, a rapider response characteristic, and a more eco-friendly feature as compared with those of a conventional light source.

In this regard, various studies and researches have been performed to substitute the conventional light source with the light emitting diode. The light emitting diode is increasingly used as light sources for lighting devices, such as various lamps used indoors and outdoors, liquid crystal displays, electric signboards, and street lamps.

DISCLOSURE

Technical Problem

The embodiment provides a light emitting device in which a plurality of lead frames electrically connected with a plurality of light emitting chips protrude in a direction toward a side having a longer length among sides of a body.

The embodiment provides a light emitting device in which a plurality of lead frames disposed on a bottom of a cavity in a body protrude in a widthwise direction perpendicular to a lengthwise direction of the body.

The embodiment provides a light emitting device in which at least three lead frames disposed in a body protrude in a widthwise direction of the body.

The embodiment provides a light emitting device in which mutually different lead frames protrude from a center of side having a longer length among sides of a body.

The embodiment provides a light emitting device in which a light emitting chip or a protective chip is disposed on each of a plurality of lead frames disposed in a body.

The embodiment provides a light emitting device in which a plurality of light emitting chips are connected with each other in parallel on a plurality of lead frames disposed in a body.

The embodiment provides a light emitting chip capable of enhancing the stiffness of a side having a longer length among sides of a body.

Technical Solution

According to the embodiment, there is provided a light emitting device including a body having a cavity; first and second frames disposed in the cavity; a third lead frame disposed in the cavity and disposed between the first and second lead frames; a fourth lead frame disposed in the cavity, disposed between the first and second lead frames, and spaced apart from the third lead frame; a first light emitting chip disposed on the first lead frame; and a second light emitting chip disposed on the second lead frame. The body includes first and second lateral sides in opposition to each other; and third and fourth lateral sides disposed in opposition to each other. The first lead frame includes first and second lead parts protruding through the first and second lateral sides. The second lead frame includes third and fourth lead parts protruding through the first and second lateral sides. The third lead frame includes a fifth lead part protruding through the first lateral side, and the fourth lead frame includes a sixth lead part protruding through the second lateral side.

According to the embodiment, there is provided a light emitting device including: a body having a cavity; first and second lead frames disposed in the cavity; third and fourth lead frames disposed in the cavity and disposed between the first and second lead frames; a first light emitting chip disposed on the first lead frame; a second light emitting chip disposed on the second lead frame; a first protective chip disposed on the third lead frame; and a second protective chip disposed on the fourth lead frame. Each of the first and second lead frames includes a plurality of lead parts protruding through first and second lateral sides, which have longer lengths, among lateral sides of the body. The third and fourth lead frames include lead parts protruding through the first or second lateral side, which has a longer length, among the lateral sides of the body. The lead part of the third lead frame protrudes in a direction opposition to a direction that the lead part of the fourth lead part protrudes.

Advantageous Effects

The embodiment may enhance stiffness at the central portion of the light emitting device having a length greater than a width.

The embodiment may improve the reliability in the structure of the light emitting device.

The embodiment may improve the heat radiation efficiency of the light emitting device.

The embodiment may improve the reliability of the light emitting device and the lighting device including the same.

BEST MODE

Mode for Invention

Figure 1:
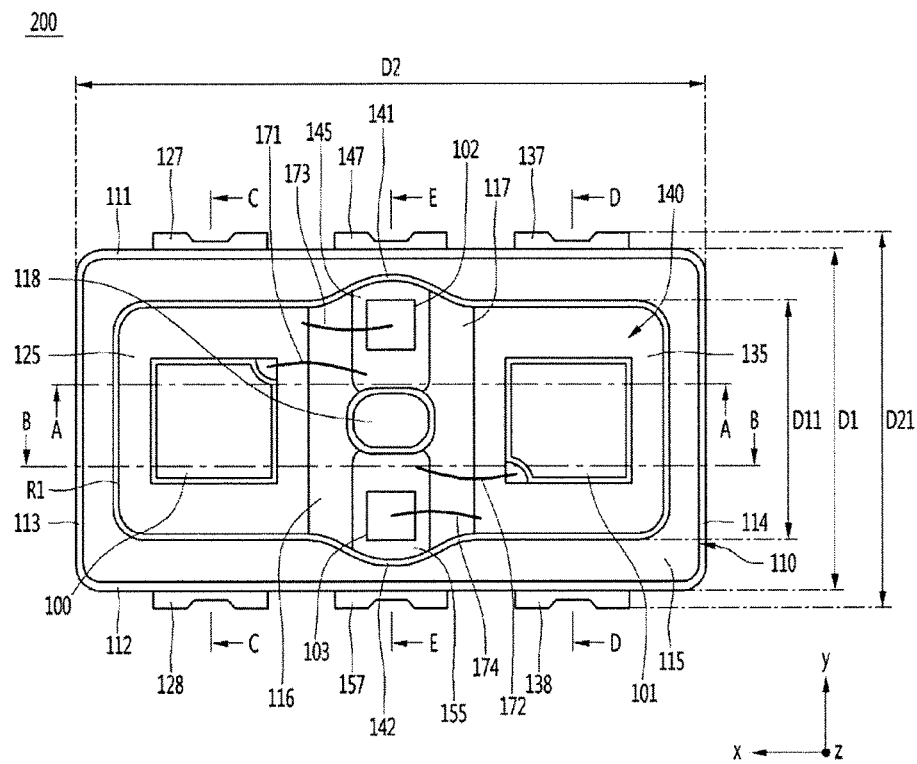
FIG. 1 is a top view showing a light emitting device according to the embodiment.

In the description of the embodiment, it will be understood that, when a substrate, a frame, a sheet, a layer, or a pattern is referred to as being "on" or "under" a substrate, a frame, a sheet, a layer, or a pattern, each can be "directly/indirectly" on and under the substrate, the frame, the sheet, the layer, or the pattern, or one or more intervening elements may also be present. Such a position of each element will be described with reference to the drawings.

Hereinafter, embodiments will be more apparently understood with reference to accompanying drawings. In addition, the same reference numerals will be assigned to the same elements in the description with reference to accompanying drawings.

Hereinafter, a light emitting device according to the embodiment will be described with reference to accompanying drawings.

Figure 2:
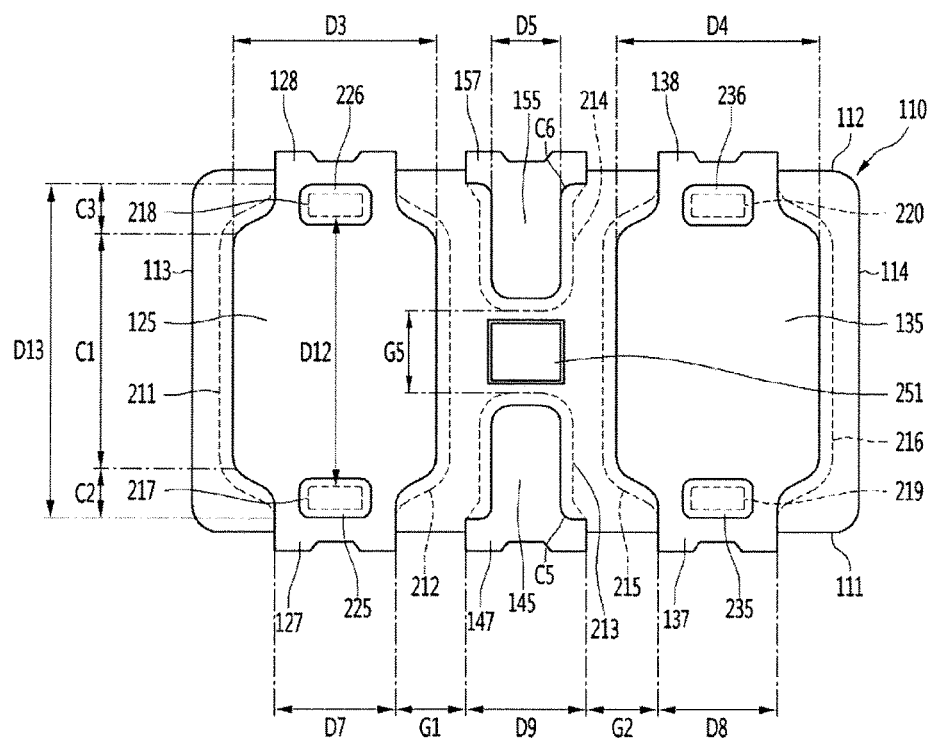
FIG. 2 is a rear view showing the light emitting device of FIG. 1.
Figure 3:
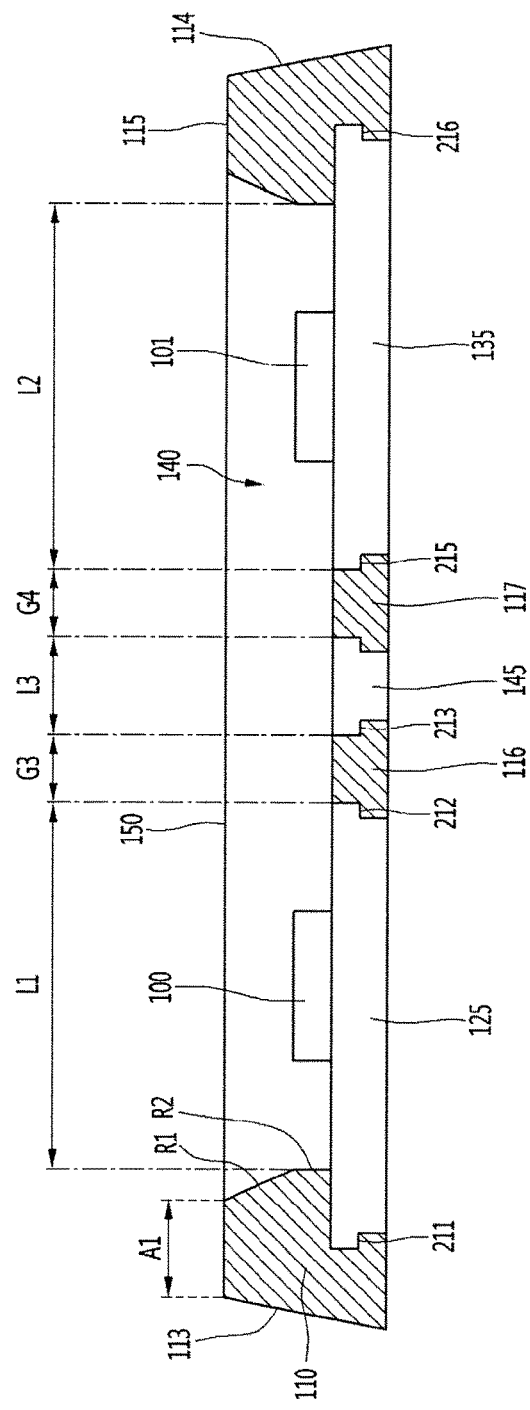
FIG. 3 is a sectional view taken along line A-A of the light emitting device of FIG. 1.
Figure 4:
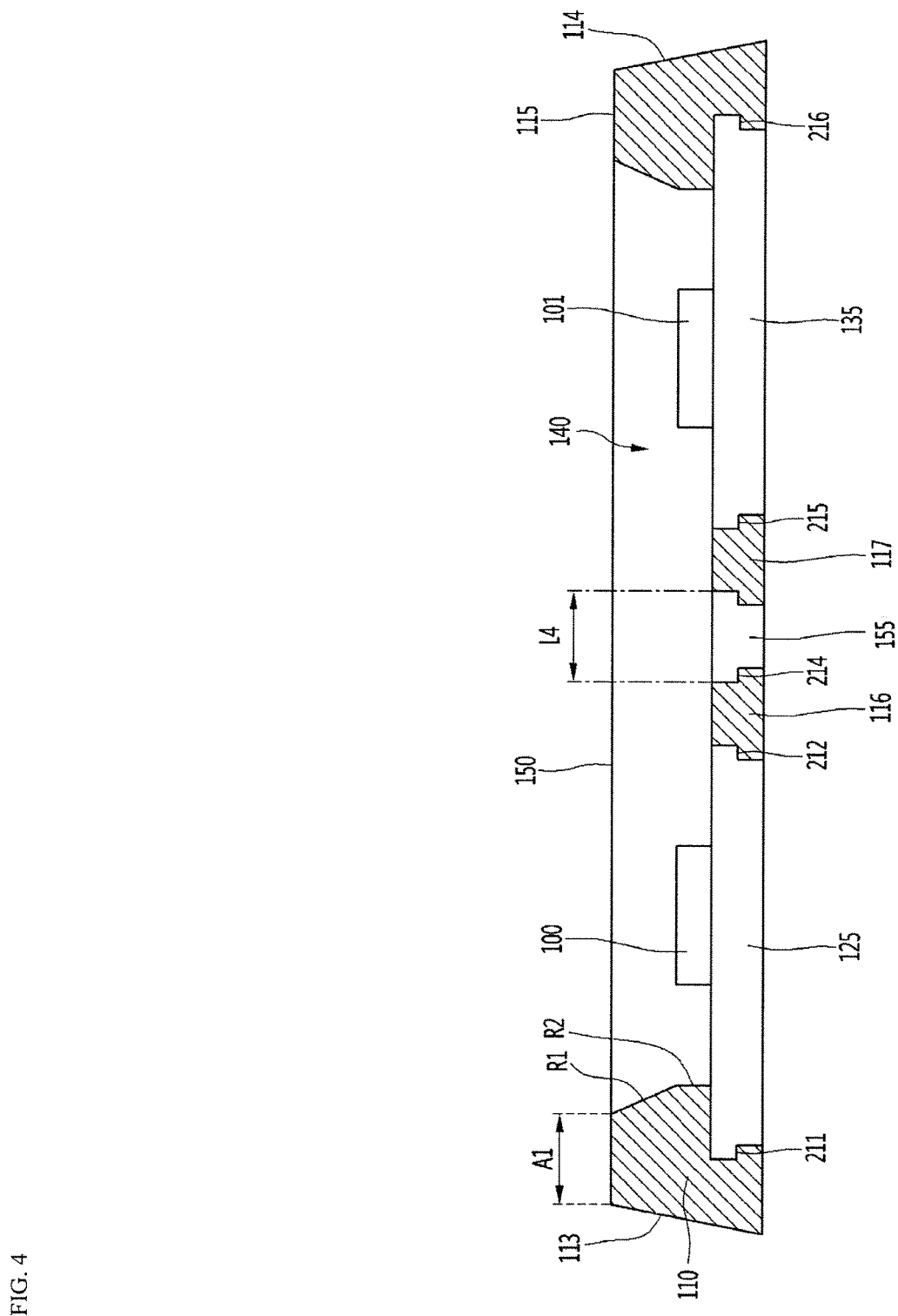
FIG. 4 is a sectional view taken along line B-B of the light emitting device of FIG. 1.
Figure 5:
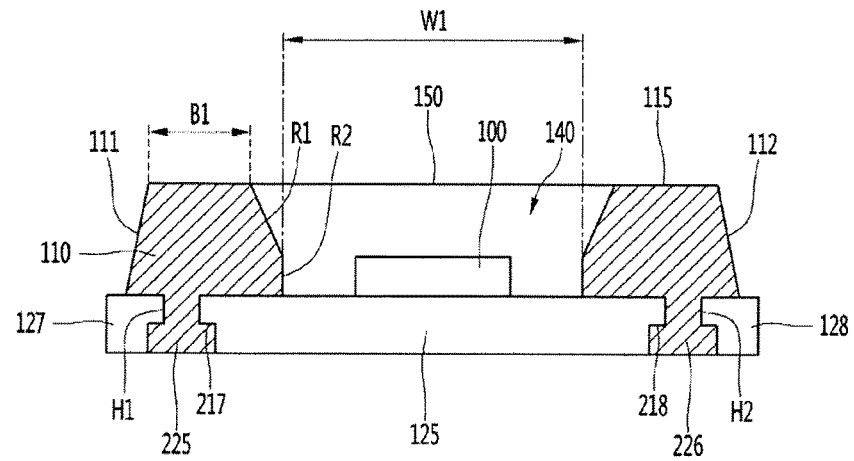
FIG. 5 is a sectional view taken along line C-C of the light emitting device of FIG. 1.
Figure 6:
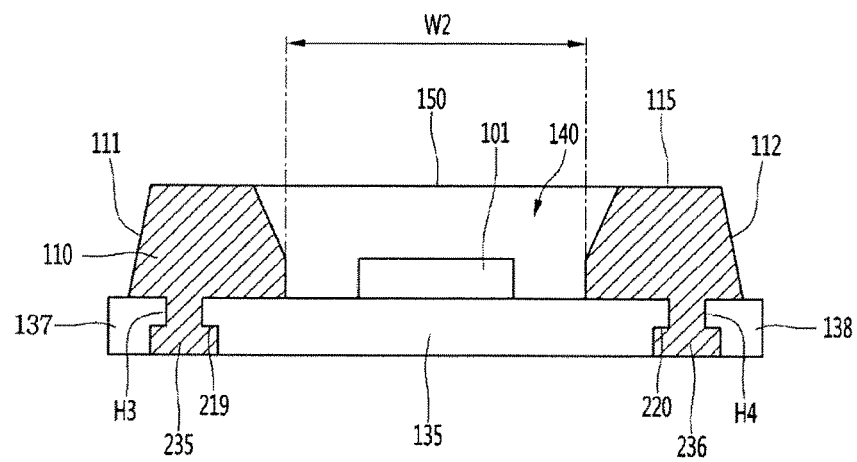
FIG. 6 is a sectional view taken along line D-D of the light emitting device of FIG. 1.
Figure 7:
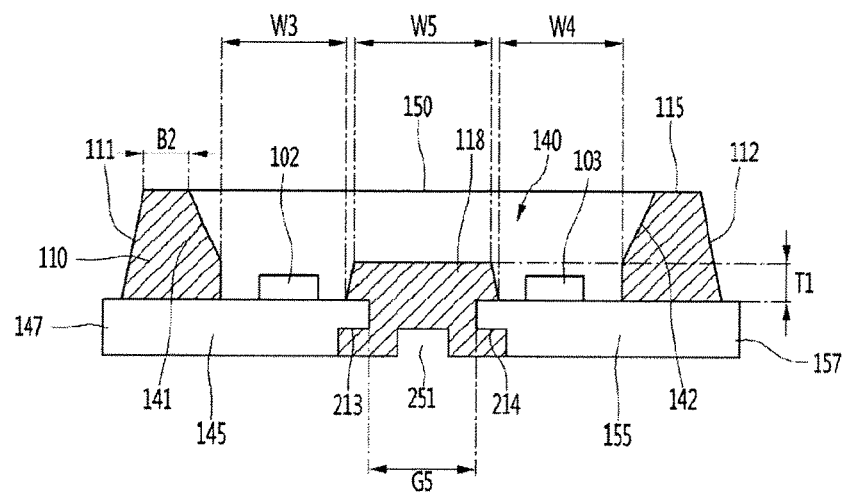
FIG. 7 is a sectional view taken along line E-E of the light emitting device of FIG. 1.

FIG. 1 is a top view showing a light emitting device according to the embodiment, FIG. 2 is a rear view showing the light emitting device of FIG. 1, and FIG. 3 is a sectional view taken along line A-A of the light emitting device of FIG. 1. FIG. 4 is a sectional view taken along line B-B of the light emitting device of FIG. 1, FIG. 5 is a sectional view taken along line C-C of the light emitting device of FIG. 1, and FIG. 6 is a sectional view taken along line D-D of the light emitting device of FIG. 1. FIG. 7 is a sectional view taken along line E-E of the light emitting device of FIG. 1.

Referring to FIGS. 1 to 7, a light emitting device 200 includes a body 110 having a cavity 140, a plurality of lead frames 125, 135, 145, and 155, portions of which are coupled to the body 110, which are disposed in the cavity 140, a plurality of light emitting chips 100 and 101 disposed in the cavity 140 and electrically connected with the lead frames 125, 135, 145, and 155, and a plurality of protective chips 102 and 103 disposed in the cavity 140 and electrically connected with the light emitting chips 100 and 101.

The light emitting device 200 according to the embodiment may include the light emitting chips 100 and 101. In the light emitting device 200 according to the embodiment, the light emitting chips 100 and 101 may be connected with each other in parallel through the lead frames 125, 135, 145, and 155. The light emitting device 200 according to the embodiment includes a structure in which the lead frames 125, 135, 145, and 155 protrude in a direction toward a side having a longer length among sides of the body 110. In the light emitting device 200 according to the embodiment, the lead frames 125, 135, 145, and 155 may be arranged in a second direction (y) instead of a first direction (x) of the body 110, and the second direction (y) may be perpendicular to the first direction (x).

The body 110 of the light emitting device 200 according to the embodiment may include an insulating material. The body 110 may be formed of a material having a reflective index higher than transmittance, for example, a reflective index of at least 70% with respect to wavelengths of light emitted from the light emitting chips 100 and 101. If the reflective index is at least 70%, the body 110 may be formed of a non-transmissive material or a reflective material. The body 110 may be formed of a resin-based insulating material, for example, a resin material, such as polyphthalamide (PPA). The body 110 may include thermosetting resin including a silicone-based material, an epoxy-based material, or a plastic material, a high heat resistance material, or a high light resistance material. The body 110 including the silicone-based material includes white-based resin. In addition, the body 110 may selectively include acid anhydride, an antioxidant, a release agent, an optical reflector, an inorganic filling agent, a curing catalyst, a light stabilizer, a lubricant, or a titanium dioxide. The body 110 may be molded by using at least one selected from the group consisting of epoxy resin, modified epoxy resin, silicone resin, modified silicone resin, acrylic resin, and urethane resin. For example, the body 110 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture through heating after adding DBU(1.8-diazabicyclo(5,4,0)undecene-7) serving as a hardening accelerator and ethylene glycol, titanium oxide pigment or glass fiber serving as a promoter to the epoxy resin, but the embodiment is not limited thereto. In addition, the body 110 may include the mixture of the thermosetting resin and at least one selected from the group consisting of a diffusing agent, a pigment, a phosphor material, a reflective material, a light-shielding material, a light stabilizer, and a lubricant.

The body 110 may include a reflective material, for example, a resin material formed by adding a metallic oxide to a resin material such as epoxy or silicone, and the metallic oxide may include at least one of $TiO_2$, $SiO_2$, and $Al_2O_3$. The body 110 may effectively reflect incident light. Alternatively, the body 110 may be formed of a transmissive resin material or a resin material having a phosphor to convert the wavelength of the incident light.

Referring to FIGS. 1 and 2, the body 110 may include a plurality of outer surfaces, for example, at least four lateral sides 111, 112, 113, and 114. At least one or all of the four lateral sides 111, 112, 113, and 114 may be inclined with respect to a bottom surface of the body 110.

Regarding the first to fourth lateral sides 111, 112, 113, and 114 of the body 110, the first and second lateral sides 111 and 112 are located in opposition to each other, and the third and fourth lateral sides 113 and 114 are located in opposition to each other.

A second length D2 of each of the first and second lateral sides 111 and 112 may differ from a first length D1 of each of the third and fourth lateral sides 113 and 114. For example, the second length D2 of each of the first and second lateral sides 111 and 112 may be longer than the first length D1 of each of the third and fourth lateral sides 113 and 114. The second lengths D2 of the first and second lateral sides 111 and 112 may form a side longer than that of the first lengths D1 of the third and fourth lateral sides 113 and 114. The first lengths D1 of the third and fourth lateral sides 113 and 114 may form a side shorter than that of the second lengths D2 of the first and second lateral sides 111 and 112.

The second length D2 of the first lateral side 111 or the second lateral side 112 may be a distance between the third lateral side 113 and the fourth lateral side 114. The second length D2 may be a length extending in the first axial (x) direction, and the first length D1 may be a length extending in the second axial (y) direction. The second axial (y) direction is a widthwise direction or a longer-side direction of the body 110. The first axial (x) direction is a lengthwise direction or a longer-side direction of the body 110. The second axial (y) direction is perpendicular to the first axial (x) direction.

Corner portions, which are boundaries regions among the first to fourth lateral sides 111, 112, 113, and 114, may have angled surfaces or curved surfaces, but the embodiment is not limited thereto.

The second length D2 of the longer side of the body 110 may range from more than one time to at least two times the first length D1 of the shorter side. In detail, the second length D2 may range from 1.3 times to 2 times the first length D1. If the second length D2 becomes more than two times the first length D1, stiffness may be weakened in boundary regions among the lead frames 125, 135, 145, and 155. If the second length D2 becomes less than one time the first length D1, it may be difficult to arrange a plurality of light emitting chips having large areas or to provide the light emitting chips in parallel within one light emitting device. In this case, each of the light emitting chips 100 and 101 may be defined as a chip which has a size of 0.6 mm or more, for example, 1 mm or more in width and length. The chip having such a size may be a large-area chip. Since the second length D2 of the longer side of the body 110 is two times or less the first length D1, the intermediate portion of the body 110 may be prevented from being bent or broken in a manufacturing process such as an injection molding process.

In the body 110 of the light emitting device according to the embodiment, the second lengths D2 of the first and second lateral sides 111 and 112 may be longer than the first lengths D1 of the third and fourth lateral sides 113 and 114. The first and second lead frames 125 and 135 on which the light emitting chips 100 and 101 are disposed may be arranged with longer lengths in the second axial (y) direction of the body 110. In the case that the first and second lead frames 125 and 135 having the light emitting chips 100 and 101 disposed thereon are arranged in the first axial (x) direction of the body 110 and lead parts of the first and second lead frames 125 and 135 protrude through the third and fourth lateral sides 113 and 114, when the first and second lead frames 125 and 135 having protective chips 102 and 103 disposed thereon are disposed between the first and second lead frames 125 and 135, it is difficult to ensure the space of the first and second lead frames 125 and 135 having the protective chips 102 and 103 therein, and it is difficult to ensure a heat radiation area of the first and second lead frames 125 and 135 having the light emitting chips 100 and 101. Accordingly, the heat radiation efficiency of the light emitting device may be degraded.

According to the embodiment, the first and second lead frames 125 and 135 having the light emitting chips 100 and 101 disposed thereon are longitudinally arranged in a widthwise direction of the body 110. In addition, the lead parts of the first and second lead frames 125 and 135 may protrude through the first and second lateral sides 111 and 112. Accordingly, the heat radiation areas of the first and second lead frames 125 and 135 having the light emitting chips 100 and 101 disposed thereon may be ensured, and the heat radiation efficiency of the light emitting device may be improved.

The body 110 includes the cavity 140 having an open upper portion. The cavity 140 may be provided in a shape that is concavely recessed from a top surface 115 of the body 110, but the embodiment is not limited thereto.

An inner sidewall provided around the cavity 140 may include a surface inclined with respect to a straight line horizontal to a bottom of the body 110. As shown in FIGS. 4 to 7, inner sidewalls R1 and R2 of the cavity 140 include the first sidewall R1 inclined with respect to the bottom of the cavity 140 and the second sidewall R2 disposed between the first sidewall R1 and the bottom of the cavity 140. The second sidewall R2 may have an angle smaller than an angle of the first sidewall R1 with respect to the horizontal linear line.

The first sidewall R1 may be inclined at an angle of 115° or more, for example, an angle in the range of 115° to 175° with respect to a line extending horizontally to a top surface of the first lead frame 125 in order to reflect light emitted from the light emitting chip 100 or 101. The second sidewall R2 may be disposed at an angle of 90° or more, for example, an angle in the range of 90° to 110° with respect to the line extending horizontally to the top surface of the first lead frame 125. Since the second sidewall R2 is hardly inclined, the second sidewall R2 may prevent a portion of the body 110 from being present in the form of a burr on the lead frames 125, 135, 145, and 155 and may prevent light loss or the degradation of adhesive force resulting from the burr. Corner portions of the sidewalls R1 and R2 of the cavity 140 may have curved surfaces or angled surfaces, but the embodiment is not limited thereto.

As shown in FIGS. 4 and 5, in the body 10, widths B1 of top surfaces 115 adjacent to the first and second lateral sides 111 and 112 may be equal to or wider than widths A1 of top surfaces 115 adjacent to third and fourth lateral sides 113 and 114. Accordingly, the first length D1 of the light emitting device 200 may increase the widths B1 of the top surfaces 115 adjacent to the first and second lateral sides 111 and 112. Accordingly, the coupling force among the first and second lateral sides 111 and 112 and the first to fourth lead frames 125, 135, 145, and 155 may be strengthened. Accordingly, the stiffness may be enhanced at a longer side of the body 110.

The lead frames 125, 135, 145, and 155 are disposed in the cavity 140 of the body 110. The lead frames 125, 135, 145, and 155 may include at least three or four lead frames. The lead frames 125, 135, 145, and 155 may be disposed in the widthwise direction instead of the lengthwise direction of the body 110. The lead frames 125, 135, 145, and 155 may be disposed with a longer length in the second axial (y) direction rather than the first axial (x) direction. The direction of a longer length among lengths of the lead frames 125, 135, 145, and 155 may be the widthwise direction of the body 110. At least two of the lead frames 125, 135, 145, and 155 may have lengths longer than the length D1 extending in the second axial (y) direction of the body 110. At least two of the lead frames 125, 135, 145, and 155 may have lengths shorter than the length D1 extending in the second axial (y) direction of the body 110.

The lead frames 125, 135, 145, and 155 may be spaced apart from each other and may be coupled to the body 110.

At least three of the lead frames 125, 135, 145, and 155 may protrude through the first lateral side 111 of the body 110. At least three of the lead frames 125, 135, 145, and 155 may protrude through the second lateral side 112 of the body 110.

Any one of the light emitting chips 100 and 101 and the protective chips 102 and 103 may be disposed in each of the lead frames 125, 135, 145, and 155. The lead frames 125, 135, 145, and 155 may include the first to fourth lead frames 125, 135, 145, and 155. The first and second lead frames 125 and 135 are spaced apart from each other in the first axial (x) direction or the lengthwise direction of the body 110, and the third and fourth lead frames 145 and 155 may be spaced apart from in the second axial (y) direction or the widthwise direction of the body 110. The third and fourth lead frames 145 and 155 may be disposed between the first and second lead frames 125 and 135. The third and fourth lead frames 145 and 155 may be aligned in a line between the first and second lead frames 125 and 135. The first, third, and second lead frames 125, 145, and 135 may be arranged in parallel to each other. The first, fourth, and second lead frames 125, 155, and 135 may be arranged in parallel to each other.

As shown in FIGS. 1, 2, 3, and 5, the first lead frame 125 is disposed under a first region of the cavity 140 and coupled to the body 110. The length L1 and the width W1 of the first lead frame 125 exposed through the cavity 140 may be equal to each other or may be different from each other. For example, the length L1 or the width W1 of the first lead frame 125 may be 1.0 mm or more, in detail, in the range of 1.0 mm and 3.5 mm. If the length L1 or the width W1 is less than a value in the range, the mounting of the first light emitting chip 100 may be difficult. If the length L1 or the width W1 may be greater than the value in the range, a package size may be increased. The first lead frame 125 includes a plurality of lead parts. For example, the first lead frame 125 includes first and second lead parts 127 and 128 protruding in directions opposite to each other. The first lead part 127 protrudes through the first lateral side 111 of the body 110 from the first lead frame 125 disposed in the cavity 140. The second lead part 128 protrudes through the second lateral side 112 of the body 110 from the first lead frame 125 disposed in the cavity 140.

As shown in FIGS. 1, 2, 3, and 6, the second lead frame 135 is disposed under a second region of the cavity 140 and coupled to the body 110. The length L2 and the width W2 of the second lead frame 135 exposed through the cavity 140 may be equal to each other or may be different from each other. For example, the length L2 or the width W2 of the second lead frame 135 may be 1.0 mm or more, in detail, in the range of 1.0 mm and 3.5 mm. If the length L2 or the width W2 is less than a value in the range, the mounting of the second light emitting chip 101 may be difficult. If the length L2 or the width W2 may be greater than the value in the range, the package size may be increased. The length L2 may be equal to or different from the length L1 of the first lead frame 125. For example, the ratio of L1:L2 may be in the range of 3:1 to 1:3, but the embodiment is not limited thereto. The second lead frame 135 includes a plurality of lead parts. For example, the second lead frame 135 includes third and fourth lead parts 137 and 138 protruding in directions opposite to each other. The third lead part 137 protrudes through the first lateral side 111 of the body 110 from the second lead frame 135 disposed in the cavity 140. The fourth lead part 138 protrudes through the second lateral side 112 of the body 110 from the second lead frame 135 disposed in the cavity 140.

The first region in the cavity 130 may be adjacent to the first, second, and third lateral sides 111, 112, and 113 of the body 110. The second region may be adjacent to the first, second, and fourth lateral sides 111, 112, and 114 of the body 110.

As shown in FIGS. 1, 2, 3, and 7, the third lead frame 145 is disposed in the third region between the first region and the second region in the cavity 140. The third region may be an region disposed between the first and second regions and adjacent to the first lateral side 111. A length L3 of an region of the third lead frame 145, which is exposed through the cavity 140, may be 120 μm or more, for example, 150 μm or more for the mounting of the first protective chip 102. If the length L3 is a smaller value, there may be a difficulty in a stitch bonding process of the first protective chip 102. As shown in FIGS. 3 and 7, in the third lead frame 145, a width W3 of the region exposed through the cavity 140 may be greater than the length L3 of the third lead frame 145. Accordingly, a wire bonding space for the connection with the first protective chip 102 may be provided.

The third lead frame 145 is disposed in a region between the first and second lead frames 125 and 135 and includes at least one lead part, for example, a fifth lead part 147. The fifth lead part 147 may protrude through the first lateral side 111 of the body 110 from the third lead frame 145 disposed in the cavity 140. The fifth lead part 147 may be disposed at an outside of the first lateral side 111 of the body 110 and may be disposed between the first and third lead parts 127 and 137. Since the fifth lead part 147, which has an outer width wider than an inner width of the third lead frame 145, may be coupled to an inner part of the body 110, the coupling force between the fifth lead part 147 and the body 110 may be strengthened. Accordingly, the separation of the third lead frame 145 may be prevented. Here, in the third lead frame 145, the inner width may be a width of a region disposed inside the cavity 140, and the outer width may be a width of area region disposed under the first lateral side 111.

As shown in FIGS. 1, 2, 4, and 7, the fourth lead frame 155 is disposed in the fourth region between the first region and the second region in the cavity 140. The fourth region may be an region disposed between the first and second regions and adjacent to the second lateral side 112. A length L4 of the fourth lead frame 155 may be 120 μm or more, for example, 150 μm or more for the mounting of the second protective chip 103. If the length L4 is a smaller value, there may be a difficulty in a stitch bonding process of the second protective chip 102. As shown in FIGS. 3 and 7, in the fourth lead frame 155, a width W4 of a region exposed through the cavity 140 may be greater than the length L4. Accordingly, a wire bonding space for the connection with the second protective chip 103 may be provided.

The fourth lead frame 155 is disposed in a region between the first and second lead frames 125 and 135 and includes at least one lead part, for example, a sixth lead part 157. The sixth lead part 157 may protrude through the second lateral side 112 of the body 110 from the fourth lead frame 155 disposed in the cavity 140. The sixth lead part 157 may be disposed at an outside of the second lateral side 112 of the body 110 and may be disposed between the second and fourth lead parts 128 and 138. The sixth lead part 157 may protrude in a direction opposite to a direction that the fifth lead part 147 protrudes. Since the sixth lead part 157, which has an outer width wider than an inner width of the fourth lead frame 155, may be coupled to an inner part of the body 110, the coupling force between the sixth lead part 157 and the body 110 may be strengthened. Accordingly, the separation of the fourth lead frame 155 may be prevented. Here, in the third lead frame 145, the inner width may be a width of a region disposed inside the cavity 140, and the outer width may be a width of a region disposed under the first lateral side 112.

Regarding the distance between the third and fourth lead frames 145 and 155, a distance G5 between top surfaces is in the range of 0.8 mm±0.1 mm, and a distance between bottom surfaces may be in the range of 0.6 mm±0.05 mm. The electrical interference may be prevented due to the distance between the third and fourth lead frames 145 and 155, and the coupling force between the third and fourth lead frames 145 and 155 and a protrusion part 118 may be weakened.

As shown in FIGS. 1 and 2, in the first and second lead frames 125 and 135, regions C2 and C3, which are out of the cavity 140, may have rounded shapes and may extend in the forms of the lead parts 127, 128, 137, and 138. In the third lead frame 145, a region C5, which is out of the cavity 140, may have a rounded shape and may extend in the form of the fifth lead part 147. In the fourth lead frame 155, a region C6, which is out of the cavity 140, may have a rounded shape and may extend in the form of the sixth lead part 157. Accordingly, the coupling with the body 110 may be enhanced due to the regions C2, C3, C5, and C6 having the rounded shapes. The region C5, which has the rounded shape, of the third lead frame 145 may be disposed outward of the regions C2, which has the rounded shape, of the first and second lead frames 125 and 135. The region C6, which has the rounded shape, of the fourth lead frame 155 may be disposed outward of the regions C3, which has the rounded shape, of the first and second lead frames 125 and 135. In this case, a non-curved region C1 may be disposed between the regions C2 and C3, which are out of the cavity 140, of the first and second lead frames 125 and 135.

As shown in FIGS. 1 and 2, the first, third, and fifth lead parts 127, 137, and 147 protrude through the first lateral side 111 of the body 110, and the second, fourth, and sixth lead parts 128, 138, and 157 protrude through the second lateral side 112 of the body 110. The second, fourth, and sixth lead parts 128, 138, and 157 protrude in a direction opposite to a direction that the first, third, and fifth lead parts 127, 137, and 147 protrude, based on the body 110. The lead parts 127, 137, and 147 protruding through the first lateral side 111 of the body 110 and the lead parts 128, 138, and 157 protruding through the second lateral side 112 may be used as test terminals or bonding terminals.

Distances G1 and G2 among the first, third, and fifth lead parts 127, 137, and 147 protruding through the first lateral side 111 may equal to each other or may be different from each other. The distances G1 and G2 may be wider than widths G3 and G4 of first and second spacer parts 116 and 117 shown in FIG. 3. Distances among the second, fourth, and sixth lead parts 128, 138, and 157 protruding through the second lateral side 112 may equal to each other or may be different from each other. The distances may be wider than widths G3 and G4 of first and second spacer parts 116 and 117 shown in FIG. 3. The distance G3 or G4 between adjacent lead parts may be narrower than a width D7 of the lead part 127 or 128, a width D8 of the lead part 137 or 138, or a width D9 of the lead part 147 or 157.

The bottom surfaces of the first to fourth lead frames 125, 135, 145, and 155 disposed in the cavity 140 may be exposed to the bottom of the body 110. The first to sixth lead parts 127, 128, 137, 138, 147, and 157 may be arranged on the same horizontal plane as the bottom of the body 110. The bottom surfaces of the first to sixth lead parts 127, 128, 137, 138, 147, and 157 may be exposed to the outside of the bottom of the body 110. The first to fourth lead frames 125, 135, 145, and 155 may be bonded to a circuit board together with the first to sixth lead parts 127, 128, 137, 138, 147, and 157. The first to sixth lead parts 127, 128, 137, 138, 147, and 157 may protrude through the lateral sides 111 and 112 of the body 110 by 0.10 mm or more, in detail, 0.15 mm or more. The protruding lengths of the lead parts 127, 128, 137, 138, 147, and 157 may be provided as lengths sufficient to serve as test terminals or as lead terminals.

Referring to FIGS. 1 and 4, the first spacer part 116 may be coupled to a region between the first lead frame 125 and the third and fourth lead frames 145 and 155. The first spacer part 116 may be formed of a material the same as that of the body 110 or may include an insulating material different from that of the body 110. The second spacer part 117 may be coupled to a region between the second lead frame 135 and the third and fourth lead frames 145 and 155. The first spacer part 117 may be formed of a material the same as that of the body 110 or may include an insulating material different form that of the body 110. The first and second spacer parts 116 and 117 may be connected with each other. The first and second spacer parts 116 and 117 may be connected with each other through a region between the third and fourth lead frames 145 and 155. The first and second spacer parts 116 and 117 may be connected with each other. The body 110 may include the first and second spacer parts 116 and 117.

Referring to FIGS. 1, 4, and 7, a protrusion part 118 may protrude from a region between the first and second spacer parts 116 and 117. The protrusion part 118 may be formed of a material the same as those of the first and second spacer parts 116 and 117 and may be connected with the first and second spacer parts 116 and 117. The protrusion part 118 may be formed of a material the same as that of the body 110. The protrusion part 118 may have at least one of a circular shape, a polygonal shape, an oval shape, and a polygonal shape having a curved corner when viewed from the top view, but the embodiment is not limited thereto. The protrusion part 118 may protrude in the shape of a prism having a width narrowed toward a top surface thereof. In addition, when the lateral side of the protrusion part 118 is a curved surface, the radius of curvature of the curved surface may be in the range of 0.2 mm±0.05 mm Due to the curved surface, incident light may be reflected in different directions. The lateral side of the protrusion part 118 may be provided in the form of a curved surface rather than an angled surface, for light reflection.

The protrusion part 118 may protrude from a region between the third and fourth lead frames 145 and 155. The protrusion part 118 may extend upward from portions of top surfaces of the third and fourth lead frames 145 and 155. The protrusion part 118 may be coupled to the third and fourth lead frames 145 and 155 and may overlap with the portions of the top surfaces of the third and fourth lead frames 145 and 155 in a vertical direction. A circumferential surface of the protrusion part 118 may be an inclined surface. An opposite region to the protrusion part 118 may include a recess region 251. The recess region 251 may be provided in a lower portion of the body 110. The recess region 251 may be a hole to be engaged with an injection gate in an injection molding process. The side sectional shape of the recessed region 251 may be a polygonal shape or a hemispherical shape, but the embodiment is not limited thereto. The depth of the recess region 251 may be less than the heights of the third and fourth lead frames 145 and 155. If the recess region 251 is formed with the depth arriving at the top surfaces of the third and fourth lead frames 145 and 155, the stiffness may be weakened in the first and second spacer parts 116 and 117.

Since the recess region 251 has the distance, which ranges between 0.05 mm and 0.3 mm, from the third and fourth lead frames 145 and 155, the region between the recess region 251 and the third and fourth lead frames 145 and 155 may be prevented from being broken.

The top surface of the protrusion part 118 may be higher than the top surfaces of the third and fourth lead frames 145 and 155 and may be lower than the top surface 115 of the body 110. The top surface of the protrusion part 118 may be higher than top surfaces of the first spacer part 116 and the second spacer part 117. If the protrusion part 118 does not protrude, the coupling force between the third and fourth lead frames 145 and 155 may be weakened or the third and fourth lead frames 145 and 155 may be broken. If the protrusion part 118 has a thickness thicker than a thickness Ti, the protective chips 102 and 103 may not be mounted. As shown in FIG. 7, a width W5 of the protrusion part 118 may be narrower than widths W3 and W5 of portions of the third and fourth lead frames 145 and 155 exposed through the bottom of the cavity 140. In the protrusion part 118, a ratio of a width to a length may range from 3:1 to 1:3 when viewed from a top view as shown in FIG. 1, but the embodiment is not limited thereto. The protrusion part 118 and the first and second spacer parts 116 and 117 are coupled to the third and fourth lead frames 145 and 155 to support the third and fourth lead frames 145 and 155.

The protrusion part 118 may be positioned at the central region between the first and second lead frames 125 and 135 and may be positioned at the central region between the third and fourth lead frames 145 and 155. The shape of the cavity 140 may be a line-symmetrical shape about the protrusion part 118.

As shown in FIGS. 2 to 4, outer portions of the first lead frame 125 may include first and second stepped structures 211 and 212. Portions of the body 110 may be coupled into the first and second stepped structures 211 and 212. The first and second stepped structures 211 and 212 may be provided along both outer portions of the first lead frame 125, for example, along both edges of the first lead frame 125. The first stepped structure 211 may be coupled to the inside of the third lateral side 113 along the third lateral side 113 of the body 110. The first stepped structure 211 may extend inside the first and second lateral sides 111 and 112 of the body 110. The second stepped structure 212 may be coupled to the first spacer part 116 along the first spacer part 116. The first stepped structure 212 may extend inside the first and second lateral sides 111 and 112 of the body 110. The depths of the first and second stepped structures 211 and 212 may be 0.01 mm or more, in detail, 0.02 mm or more from the edge of the first lead frame 125. If the depths are less than the numeric values, coupling force may be weakened. Recess heights of the first and second stepped structures 211 and 212 may be in the range of ⅓ to ½ of the thickness of the first lead frame 125. If the recess heights of the first and second stepped structures 211 and 212 go beyond the range, coupling force may be weakened or the stepped portion may be broken.

Lengths D13 of the first and second stepped structures 211 and 212 disposed at the outer portions of the first lead frame 125 may be greater than a width D11 of the cavity 140 of FIG. 1. Accordingly, the contact area between the first and second stepped structures 211 and 212 and the body 110 may be increased. The lengths D13 of the first and second stepped structures 211 and 212 may be less than the second length D1 of the body 110. The first and second stepped structures 211 and 212 may be spaced apart from the surfaces of the first and second lateral sides 111 and 112 of the body 110.

In the first lead frame 125, a width D3 of a bottom surface may be narrower than that of a top surface. In the first lead frame 125, an area of the top surface may be wider than that of the bottom surface. The width D3 of the bottom surface of the first lead frame 125 may be wider than the widths D7 of the first and second lead parts 127 and 128. In the first lead frame 125, the difference between the width D3 of the bottom surface and the width D7 may be 0.05 mm or more, in detail, in the range of 0.05 mm to 0.2 mm. If the difference between the width D3 of the bottom surface and the width D7 is less than a value in the range, the coupling force with the body 110 may be weakened. If the difference between the width D3 of the bottom surface and the width D7 is greater than the value in the range, the functions of the first and second lead parts 127 and 128 may be degraded.

The first and second lead parts 127 and 128 may be disposed under the body 110. The first and second lead parts 127 and 128 protrude with the width D7 narrower than the width D3 of the bottom surface of the first lead frame 125, thereby preventing the stiffness from being weakened in the first and second lateral sides 111 and 112 of the body 110.

The second lead frame 135 may include third and fourth stepped structures 215 and 216 formed at outer portions thereof. Portions of the body 110 may be coupled to the third and fourth stepped structures 215 and 216. The third and fourth stepped structures 215 and 216 may be provided along both outer portions of the second lead frame 135, for example, both edges of the second lead frame 135. The third stepped structure 215 may be coupled to the inside of the fourth lateral side 114 along the fourth lateral side 114 of the body 110. The third stepped structure 215 may extend inside the first and second lateral sides 111 and 112 of the body 110. The fourth stepped structure 216 may be coupled into the second spacer part 117 along the first spacer part 117. The fourth stepped structure 216 may extend inside the first and second lateral sides 111 and 112 of the body 110. The depths of the third and fourth stepped structures 215 and 216 may be 0.01 mm or more, in detail, 0.02 mm or more from the edge of the second lead frame 135. If the depths are less than the numeric values, coupling force may be weakened. Recess heights of the third and fourth stepped structures 215 and 216 may be in the range of ⅓ to ½ of the thickness of the second lead frame 135. If the recess heights of the third and fourth stepped structures 215 and 216 go beyond the range, coupling force may be weakened or the stepped portion may be broken.

Lengths D13 of the third and fourth stepped structures 215 and 216 may be greater than the width D11 of the cavity 140 of FIG. 1. The third and fourth stepped structures 215 and 216 may increase the contact area with the body 110 due to the lengths D13. The third and fourth stepped structures 215 and 216 may be disposed with lengths shorter than the first length D1 of the body 110. The third and fourth stepped structures 215 and 216 may be spaced apart from the surfaces of the first and second lateral sides 111 and 112 of the body 110.

In the second lead frame 135, a width D4 of a bottom surface may be narrower than that of a top surface. In the second lead frame 135, an area of the top surface may be wider than that of the bottom surface. In the second lead frame 135 disposed in the cavity 140, the width D4 of the bottom surface may be wider than the width D8 of the third and fourth lead parts 137 and 138. In the second lead frame 135, the difference between the width D4 of the bottom surface and the width D8 may be 0.05 mm or more, in detail, in the range of 0.05 mm to 0.2 mm. If the difference between the width D4 of the bottom surface and the width D8 is less than a value in the range, the coupling force with the body 110 may be weakened. If the difference between the width D4 of the bottom surface and the width D8 is greater than the value in the range, the functions of the third and fourth lead parts 137 and 138 may be degraded. The third and fourth lead parts 137 and 138 protrude with the width D8 narrower than the width D4 of the second lead frame 135 disposed under the body 110, thereby preventing the stiffness from being weakened in the first and second lateral sides 111 and 112 of the body 110.

The lengths D21 of the first lead frame 125 having the first and second lead parts 127 and 128 and the second lead frame 135 having the third and fourth lead parts 137 and 138 may be greater than the first width D1 of the body 110. Accordingly, since the first and second lead frames 125 and 135 have the lead parts 127, 128, 137, and 138 protruding in opposite directions to each other through the first and second lateral sides 111 and 112, the surficial areas of the first and second lead frames 125 and 135 are increased, thereby improving the heat radiation efficiency.

Referring to FIGS. 2, 3, and 7, the third lead frame 145 may include a fifth stepped structure 213 formed at the outer portion thereof. The fifth stepped structure 213 is formed on an outer periphery of the third lead frame 135 and coupled to a portion of the body 110. The fifth stepped structure 213 may be coupled to the first and second spacer parts 116 and 117 and the protrusion part 118. As shown in FIG. 7, the protrusion part 118 may protrude with the predetermined thickness T1, and the thickness T1 may be equal to or higher than the heights of the top surfaces of the first and second protective chips 102 and 103. In the third lead frame 145, the area of a top surface may be wider than that of a bottom surface due to the fifth stepped structure 213. The fifth stepped structure 213 may be spaced apart from the surfaces of the first lateral side 111 of the body 110. The depth of the fifth stepped structure 213 may be 0.01 mm or more, in detail, 0.02 mm or more from the edge of the third lead frame 145. If the depth is less than the numeric value, coupling force may be weakened. A recess height of the fifth stepped structure 213 may be in the range of ⅓ to ½ of the thickness of the third lead frame 145. If the recess height of the fifth stepped structure 213 goes beyond the range, coupling force may be weakened or the stepped portion may be broken.

Referring to FIGS. 2, 4, and 7, the fourth lead frame 155 may include a sixth stepped structure 214 formed at the outer portion thereof. The sixth stepped structure 214 is formed on an outer periphery of the fourth lead frame 155 and coupled to a portion of the body 110. The sixth stepped structure 214 may be coupled to the first and second spacer parts 116 and 117 and the protrusion part 118. In the fourth lead frame 155, the area of a top surface may be wider than that of a bottom surface due to the sixth stepped structure 214. The depth of the sixth stepped structure 214 may be 0.01 mm or more, in detail, 0.02 mm or more from the edge of the fourth lead frame 155. If the depth is less than the numeric value, coupling force may be weakened. A recess height of the sixth stepped structure 215 may be in the range of ⅓ to ½ of the thickness of the fourth lead frame 155. If the recess height of the sixth stepped structure 215 goes beyond the range, coupling force may be weakened or the stepped portion may be broken.

Widths D5 of bottom surfaces of the third and fourth lead frames 145 and 155 may be narrower than widths D9 of the fifth and sixth lead parts 147 and 157. In the fifth and sixth lead frames 145 and 155, the difference between the width D5 of the bottom surface and the width D9 may be 0.05 mm or more, in detail, in the range of 0.05 mm to 0.2 mm. If the difference between the width D5 of the bottom surface and the width D9 is less than a value in the range, the coupling force with the body 110 may be weakened. If the difference between the width D5 of the bottom surface and the width D9 is greater than the value in the range, the functions of the fifth and sixth lead parts 147 and 157 may be degraded. Here, in the bottom surfaces of the third and fourth lead frames 145 and 155, the bottom surface width D5, which serves as an inner width, may be 0.03 mm or more, in detail, in the range of 0.03 mm to 1.0 mm. The width D9, which serves as an outer width, may be 0.08 mm or more, in detail, in the range of 0.08 mm to 1.2 mm. If the bottom surface width D5 is less than a value in the range, the mounting of the protective chips 102 and 103 or the wire bonding process may be difficult. If the bottom surface width D5 is greater than the value in the range, the sizes of the first and second spacer parts 116 and 117 or the sizes of the first and second lead frames 125 and 135 may be affected.

The widths D5 of bottom surfaces of the third and fourth lead frames 145 and 155 may be narrower than widths D9 of the fifth and sixth lead parts 147 and 157, thereby preventing stiffness from being weakened in the central region of the body 110. The width D9 of the bottom surface of the fifth lead part 147 may be equal to the width of the bottom surface of the sixth lead part 157.

The stepped structures 211, 212, 213, 214, 215, and 216 of the first to fourth lead frames 125, 135, 145, and 155 may strengthen the coupling force with the body 110 and may prevent moisture from being infiltrated.

As shown in FIGS. 2 and 5, the first lead frame 125 may include a plurality of holes H1 and H2. The holes H1 and H2 may overlap with the body 110 and may be disposed in regions adjacent to the first and second lateral sides 111 and 112. For example, the holes H1 and H2 may include first and second holes H1 and H2. The first hole H1 may be disposed adjacent to the first lateral side 111 and the second hole H2 may be disposed adjacent to the second lateral side 112. The distance D12 between the first and second holes H1 and H2 may be wider than the width D11 (see FIG. 11) of the cavity 110. The first and second holes H1 and H2 may be spaced apart from lateral sides of the light emitting chips 100 and 101 and may have the distance D12 greater than the length of any one of sides of the light emitting chips 100 and 101. The first and second holes H1 and H2 may overlap with the body 110 in the vertical direction to strengthen the coupling force with the body 110. The first and second holes H1 and H2 may have at least one of a polygonal shape, a circular shape, an oval shape, and a polygonal shape having a curved corner when viewed from the bottom view. The first hole H1 may be disposed between rounded regions C2 of the first stepped structure 211 and the second stepped structure 212. The second hole H2 may be disposed between rounded regions C3 of the first stepped structure 211 and the second stepped structure 212. The first lead frame 125 may strengthen the coupling force with the body 110 through the first and second holes H1 and H2 and the rounded regions C2 and C3.

The first and second holes H1 and H2 of the first lead frame 125 may include seventh and eighth stepped structures 217 and 218. The seventh and eighth stepped structures 217 and 218 may be provided such that widths of lower portions of the first and second holes H1 and H2 are wider than those of widths of upper portions thereof. First and second coupling parts 225 and 226 may be engaged with the first and second holes H1 and H2 of the first lead frame 125. The first and second coupling parts 225 and 226 may be engaged with the first and second holes H1 and H2 such that the widths of lower portions of the first and second coupling parts 225 and 226 are wider than the widths of upper portions thereof. The seventh and eighth stepped structures 217 and 218 have predetermined heights from the bottom surface of the first lead frame 125. For example, the heights may be recessed to a value in the range of ½ to ⅓ of the thickness of the first lead frame 125. If the heights go beyond the range, the coupling force with the body 110 may be weakened, or the stepped portion may be broken.

As shown in FIGS. 2 and 6, the second lead frame 135 may include a plurality of holes H3 and H5. The holes H3 and H4 may overlap with the body 110 and may be disposed in regions adjacent to the first and second lateral sides 111 and 112. For example, the holes H3 and H4 may include third and fourth holes H3 and H4. The third hole H3 may be disposed adjacent to the first lateral side 111 and the fourth hole H4 may be disposed adjacent to the second lateral side 112. The distance D13 between the third and fourth holes H3 and H4 may be wider than the width D11 (see FIG. 11) of the cavity 140. The third and fourth holes H3 and H4 may overlap with the body 110 in the vertical direction to strengthen the coupling force between the second lead frame 135 and the body 110. The third and fourth holes H3 and H4 may have at least one of a polygonal shape, a circular shape, an oval shape, and a polygonal shape having a curved corner when viewed from the bottom view. The third hole H3 may be disposed between rounded regions C2 of the third stepped structure 215 and the fourth stepped structure 216. The fourth hole H4 may be disposed between rounded regions C3 of the third stepped structure 215 and the fourth stepped structure 216. The second lead frame 135 may strengthen the coupling force with the body 110 through the third and fourth holes H3 and H4 and the rounded regions C2 and C3.

The third and fourth holes H3 and H4 of the first lead frame 135 may include ninth and tenth stepped structures 219 and 220. The ninth and tenth stepped structures 219 and 220 may be provided such that widths of lower portions of the third and fourth holes H3 and H4 are wider than widths of upper portions thereof. Third and fourth coupling parts 235 and 236 are engaged with the third and fourth holes H3 and H4 in the second lead frame 135. The third and fourth coupling parts 235 and 236 are engaged with the third and fourth holes H3 and H4 such that the widths of lower portions of the third and fourth coupling parts 235 and 236 are wider than the widths of upper portions thereof. The third and fourth holes H3 and H4 may be spaced apart from both lateral sides of the second light emitting chip 101 and may have the distance D13 greater than the length of any one of sides of the light emitting chips 101. The ninth and tenth stepped structures 219 and 220 may have a predetermined height from the bottom surface of the second lead frame 135. For example, the heights of the ninth and tenth stepped structures 219 and 220 may be recessed to a value in the range of ½ to ⅓ of the thickness of the second lead frame 135. If the heights go beyond the range, the coupling force with the body 110 may be weakened or the stepped portion may be broken.

Referring to FIGS. 1, 5, and 7, the distance between an inner sidewall 141, which is coupled to the third lead frame 145, among the inner sidewalls of the cavity 140 provided in the body 10 and the first lateral side 111 may be provided to be narrower than the distance between the second inner sidewall R2, which is coupled to the first and second lead frames 125 and 135, of the cavity 140 and the first lateral side 111 or the second lateral side 112. The distance between the inner sidewall 142, which is coupled to the fourth lead frame 155, among the inner sidewalls of the cavity 140 provided in the body 10 and the second lateral side 112 may be provided to be narrower than the distance between the second inner sidewall R2, which is coupled to the first or second lead frame 125 or 135, of the cavity 140 and the second lateral side 112. The width B2 of the top surface 115, which is disposed between the inner sidewall 141, which is coupled to the third lead frame 145, among the inner sidewalls of the cavity 140 provided in the body 10 and the first lateral side 111, may be equal to the width of the top surface 115 provided between the inner sidewall 142, which is coupled to the fourth lead frame 155, and the second lateral side 112. The width B2 may be narrower than the width B1 of the top surface 115 disposed between the cavity 140, which is coupled to the first or second lead frame 125 or 135, and the first lateral side 111. As shown in FIG. 1, the inner sidewalls 141 and 142 of the cavity 140 may be disposed at an outer portion and disposed closer to the first and second lateral sides 111 and 112 as compared with the first inner sidewall R1. The inner sidewalls 141 and 142 may be provided in curved shapes toward the first lateral side 111 and the second lateral side 112. The inner sidewalls 141 and 142 may include surfaces vertically inclined and/or a vertical surface. Accordingly, the regions of the top surfaces of the third and fourth lead frames 145 and 155 may be ensured in the cavity 140, thereby providing the space for the stitch bonding of the first and second protective chips 102 and 103.

Bottom surfaces of the first to fourth lead frames 125, 135, 145, and 155 may be disposed on the same horizontal plane as shown in FIGS. 1 to 7. As shown in FIG. 2, the widths D3 and D4 of the bottom surfaces of the first and second lead frames 125 and 135 may be wider than the widths D5 of the bottom surfaces of the third and fourth lead frames 145 and 155 and may be wider than the widths D7, D8, and D9 of the first to fourth lead frames 125, 135, 145 and 155. The widths D5 of the bottom surfaces of the third and fourth lead frames 145 and 155 may be narrower than the widths D3 and D4 of the bottom surface of the first and second lead frames 125 and 135 and may be narrower than the widths D9 of the fifth and sixth lead parts 157 and 158. For example, the widths D5 of the bottom surfaces of the third and fourth lead frames 145 and 155 may be at most three times the widths D3 and D4 of the bottom surfaces of the first and second lead frames 125 and 135. For example, the widths D5 of the bottom surfaces of the third and fourth lead frames 145 and 155 may be in the range of 0.4 mm to 0.6 mm. If the widths D5 of the bottom surfaces of the third and fourth lead frames 145 and 155 are less than values in the range, the coupling force with the spacer parts 116 and 117 may be weakened and thus moisture may be infiltrated into the space between the third and fourth lead frames 145 and 155 and the spacer parts 116 and 117. If the widths D5 of the bottom surfaces of the third and fourth lead frames 145 and 155 are greater than values in the range, the widths D3 and D4 of the bottom surfaces of the first and second lead frames 125 and 135 may be reduced or the second length D2 of the body 110 may be increased.

In this case, as shown in FIG. 2, the widths D7 and D8 of the first to fourth lead parts 127, 128, 137, and 138 may be equal to each other, but the embodiment is not limited thereto. The ratio of the widths D7 and D8 of the first to fourth lead parts 127, 128, 137, and 138 and the widths D9 of the fifth and sixth lead parts 156 and 157 may be in the range of 2:1 to 1:1. The ratio may prevent the heat radiation area from being reduced due to the areas of the first to fourth lead parts 127, 128, 137, and 138 and may prevent the functions of the fifth and sixth lead parts 156 and 157 from being lowered.

The first to fourth lead frames 125, 135, 145, and 155 may include a metallic material, for example, at least one of titanium (Ti), copper (Cu), nickel (Ni), gold (Au), chromium (Cr), tantalum (Ta), platinum (Pt), tin (Sn), silver (Ag), and phosphor (P). The first to fourth lead frames 125, 135, 145, and 155 may include a single metallic layer or multiple metallic layers. The first to fourth lead frames 125, 135, 145, and 155 may be formed with equal thicknesses. The first to fourth lead frames 125, 135, 145, and 155 serve as terminals to feed power.

The light emitting chips 100 and 101 may be disposed in the cavity 140 and may be disposed on the first and second lead frames 125 and 135. The light emitting chips 100 and 101 may include at least two light emitting chips. For example, the light emitting chips 100 and 101 may include the first and second light emitting chips 100 and 101. The protective chips 102 and 103 may be disposed in the cavity 140 and may be disposed on the third and fourth lead frames 145 and 155. The protective chips 102 and 103 may include at least two light emitting chips. For example, the protective chips 102 and 103 may include the first and second protective chips 102 and 103.

The first light emitting chip 100 is disposed on the first lead frame 125, and the second light emitting chip 101 is disposed on the second lead frame 135. The first protective chip 102 is disposed on the third lead frame 145, and the second protective chip 103 is disposed on the fourth lead frame 155.

The first light emitting chip 100 may adhere onto the first lead frame 125 by an adhesive, for example, a conductive adhesive and thus may be electrically connected with the first lead frame 125. The first light emitting chip 100 may be connected with the third lead frame 145 by a first connection member 171, and the first connection member 171 includes a conductive wire. The conductive adhesive may include a bonding material such as solder. Since the first lead frame 125 is connected with the first light emitting chip 100 by a conductive adhesive, an additional connection member is not required for the electrical connection between the first lead frame 125 and the first light emitting chip 100.

The second light emitting chip 101 may adhere onto the second lead frame 135 by an adhesive, for example, a conductive adhesive and thus may be electrically connected with the second lead frame 135. The second light emitting chip 101 may be connected with the second lead frame 135 by a second connection member 172. The second connection member 172 includes a conductive wire. The first and second light emitting chips 101 and 102 may be connected with each other in parallel and may be individually driven. Since the second lead frame 135 is connected with the second light emitting chip 101 by a conductive adhesive, an additional connection member is not required for the electrical connection between the second lead frame 135 and the second light emitting chip 101.

The first and second light emitting chips 100 and 101 may selectively emit light in the range of a visible light band to an ultraviolet light band. For example, the first and second light emitting chips 100 and 101 may selectively include a red LED chip, a blue LED chip, a green LED chip, a yellow green LED chip, or a white LED chip. The first and second light emitting chips 100 and 101 include LED chips including at least one of a compound semiconductor of group III-V elements and a compound semiconductor of group II-VI elements. The light emitting device 200 may include the first and second light emitting chips 100 and 101 having large areas of at least 0.6 mm×0.6 mm or at least 1 mm×1 mm to improve light intensity.

The first protective chip 102 may adhere onto the third lead frame 145 by a conductive adhesive and thus may be electrically connected with the third lead frame 145. The first protective chip 102 may be connected with the first lead frame 125 and the third connection member 173. The third connection member 173 includes a conductive wire.

The second protective chip 103 may adhere onto the fourth lead frame 155 by a conductive adhesive and thus may be electrically connected with the fourth lead frame 155. The second protective chip 103 may be connected with the second lead frame 135 and the fourth connection member 174. The fourth connection member 174 includes a conductive wire.

The first and second protective chips 102 and 103 may be implemented with at least one of a thyristor, a zener diode, or a transient voltage suppression (TVS). The first light emitting chip 100 may be connected with the first protective chip 102 in parallel. The second light emitting chip 101 may be connected with the second protective chip 102 in parallel. The first and second lead frames 125 and 135 may serve as cathode electrodes of each of light emitting chips 100 and 101, and the third and fourth lead frames 145 and 155 may serve as anode electrodes of each of the light emitting chips 100 and 101.

The first and second protective chips 102 and 103 may electrically protect the first and second light emitting chips 100 and 101. Reflective materials may be disposed on the surfaces of the first and second protective chips 102 and 103. The reflective material may include at least one of a resin material such as silicone or epoxy and a metallic oxide such as $TiO_2$, $SiO_2$, or $Al_2O_3$. The reflective material may prevent light from being absorbed by the first and second protective chips 102 and 103.

A molding member 150 may be disposed in the cavity 140. The molding member 150 may include a light transmissive material such as silicone or epoxy and may be formed in a single layer or in multiple layers.

The molding member 150 may include phosphors to convert the wavelength of light emitted upward from the light emitting chip 100 or 101. The phosphors may selectively include a YAG, TAG, silicate, nitride, or oxy-nitride-based material. The phosphors may include at least one of red, yellow, blue, and green phosphors, but the embodiment is not limited thereto. The phosphors may be disposed on the first and second light emitting chips 100 and 101 such that the first and second light emitting chips 100 and 101 emit light in mutually different colors, but the embodiment is not limited thereto.

The molding member 150 may be disposed with a surface formed in at least one of a flat shape, a concave shape, and a convex shape, but the embodiment is not limited thereto. The surface of the molding member 150 may serve as a light exit surface. An optical lens may be disposed on the molding member 150. The optical lens may include, for the light emitting chips 100 and 101, a convex lens, a concave lens, or a convex lens having a total reflection surface at the central portion thereof, but the embodiment is not limited thereto.

Figure 8:
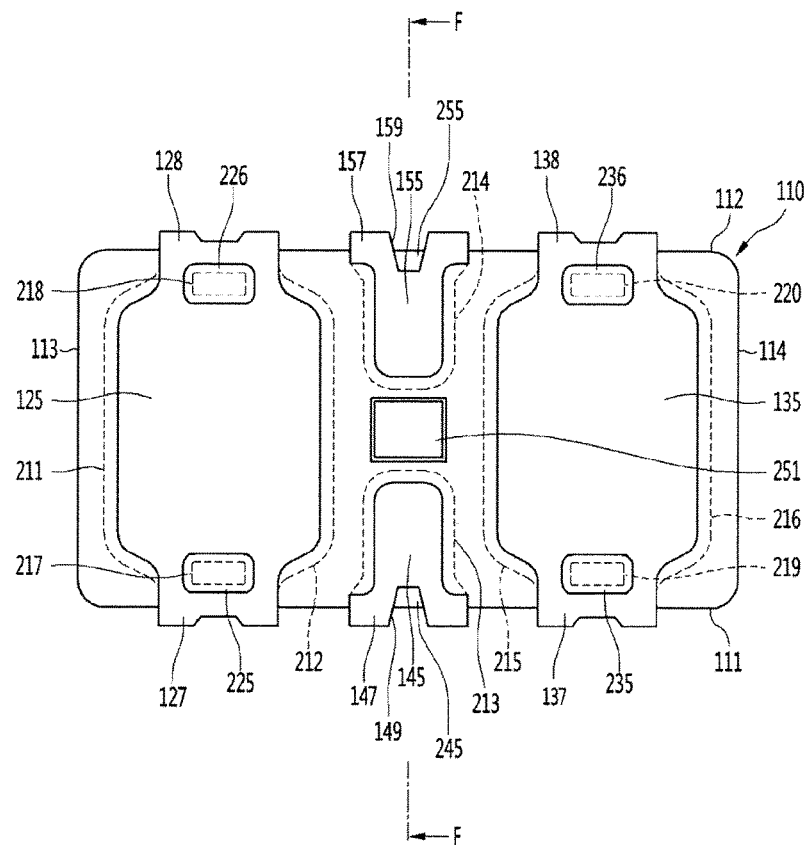
FIG. 8 is a view showing another example of the third and fourth lead frames in the light emitting device of FIG. 2.
Figure 9:
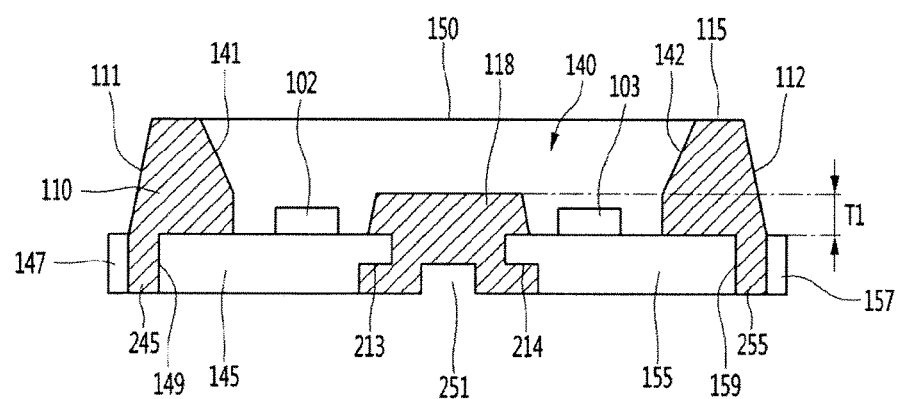
FIG. 9 is a sectional view taken along line F-F of the light emitting device of FIG. 8.

FIG. 8 is a view showing another example of the third and fourth lead frames in the light emitting device of FIG. 2. FIG. 9 is a sectional view taken along line F-F of the light emitting device of FIG. 8. In the following description with reference to FIGS. 8 and 9, the same part as that of the above described embodiment will be understood by making reference to the above described embodiment.

Referring to FIGS. 8 and 9, in the light emitting device, a first recess 149 is disposed in the third lead frame 145, and a second recess 159 is disposed in the fourth lead frame 155.

The first recess 149 is recessed from the fifth lead part 147 of the third lead frame 145, and has an off structure in a direction toward the first lateral side 111 of the body 110. A third coupling part 245 may be disposed in the first recess 149. The third coupling part 245 may be formed of a material constituting the body 110 and may be coupled to the first recess 149. The third coupling part 245 may prevent the third lead frame 145 from being separated.

The second recess 159 is recessed from the sixth lead part 157 of the fourth lead frame 155, and has an off structure in a direction toward the first lateral side 112 of the body 110. A fifth coupling part 255 may be disposed in the second recess 159. The fifth coupling part 255 may be formed of a material constituting the body 110 and may be coupled to the second recess 159. The fourth coupling part 255 may prevent the fifth lead frame 155 from being separated.

Figure 10:
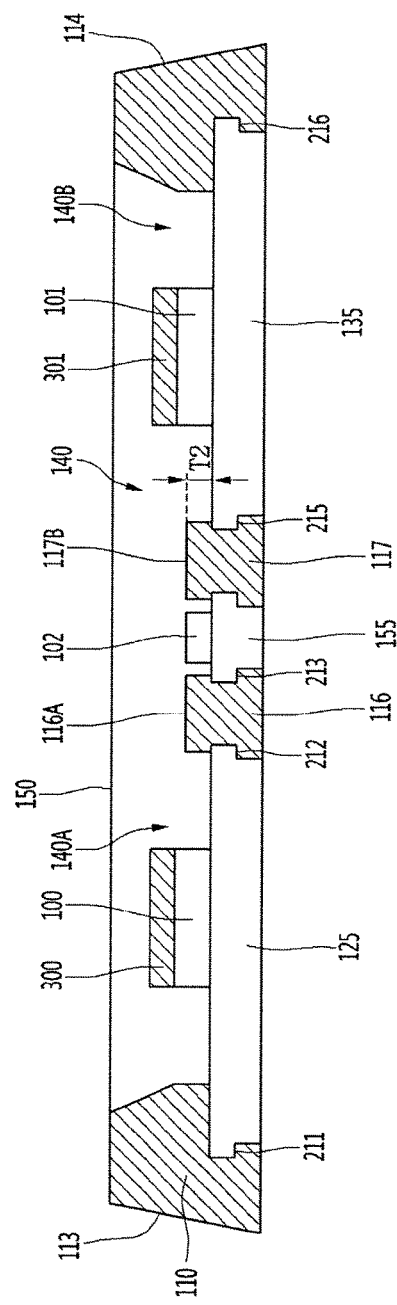
FIG. 10 is a view showing another example of the light emitting device of FIG. 3.

FIG. 10 is a view showing another example of the light emitting device of FIG. 4. In the following description with reference to FIG. 10, the same part as that of the above described embodiment will be understood by making reference to the above described embodiment.

Referring to FIGS. 10 and 1, a light emitting device includes a body 110 having a cavity 140, a plurality of lead frames 125, 135, 145, and 155 having at least portions coupled to the body 110 and disposed in the cavity 140, a plurality of light emitting chips 100 and 101 disposed in the cavity 140 and electrically connected with the lead frames 125, 135, 145, and 155, and a plurality of protective chips 102 and 103 disposed in the cavity 140 and electrically connected with the light emitting chips 100 and 101.

The first and second spacer parts 116 and 117 of the light emitting device may include first and second reflective parts 116A and 117A protruding higher than top surfaces of the first and second lead frames 125 and 135. The first reflective part 116A may protrude in a region between the first lead frame 125 and the third and fourth lead frames 145 and 155, thereby reflecting light emitted from the first light emitting chip 100. The second reflective part 117A may protrude in a region between the first lead frame 135 and the third and fourth lead frames 145 and 155, thereby reflecting light emitted from the first light emitting chip 101.

The thicknesses T2 of the first and second reflective parts 116A and 117A may be equal to or higher than top-surface heights of the first and second protective chips 102 and 103, thereby reducing light absorption by the first and second protective chips 102 and 103. In addition, according to the embodiment, reflective materials may be applied to the surfaces of the first and second protective chips 102 and 013, thereby preventing light absorption. The reflective material may include at least one of a resin material such as silicone or epoxy and a metallic oxide such as $TiO_2$, $SiO_2$, or $Al_2O_3$. The reflective material may prevent light from being absorbed by the first and second protective chips 102 and 103.

In a first region 140A of a lower portion of the cavity 140, a reflective structure may be provided around the first light emitting chip 100. In a second region 140B, a reflective structure may be provided around the second light emitting chip 101. The reflective structures may be formed by sidewalls on the periphery of the cavity 140 and the first and second reflective parts 116A and 117A. The reflective parts 116A and 117A may not be formed.

A first phosphor film 300 may be disposed on the first light emitting chip 100 and a second phosphor film 301 may be disposed on the light emitting chip 101. The first phosphor film 300 and the second phosphor film 301 may include the same phosphor or mutually different phosphors. For example, in the case of mutually different phosphors, when the first and second light emitting chips 100 and 101 emit blue light, the first phosphor film 300 may have a yellow phosphor and the second phosphor film 301 may have a red phosphor.

Alternatively, when the first and second light emitting chips 100 and 101 emit blue light, the first phosphor film 300 may have a green phosphor and the second phosphor film 301 may have a red phosphor.

In addition, when the first and second light emitting chips 100 and 101 emit blue light, the first phosphor film 300 may have yellow and green phosphors and the second phosphor film 301 may have red and green phosphors.

In addition, when the first and second light emitting chips 100 and 101 emit ultraviolet light, the first phosphor film 300 may have blue and red phosphors and the second phosphor film 301 may have a green phosphor. The types of the phosphors contained in the phosphor films 300 and 301 may depend on the light emitting chips 100 and 101, and a phosphor may be contained in the molding member 150, but the embodiment is not limited thereto.

Figure 11:
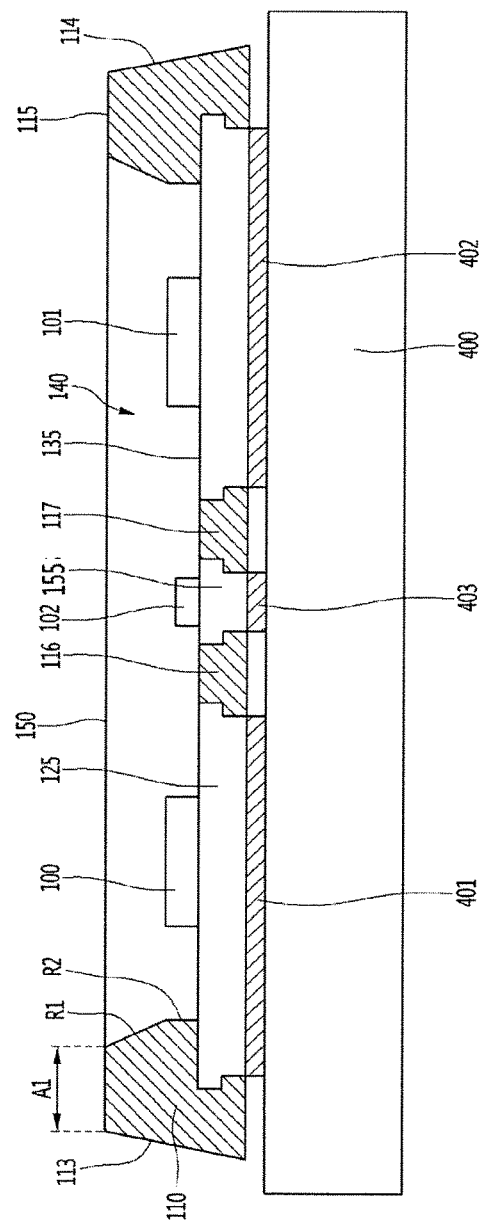
FIG. 11 is a view showing a light emitting module having the light emitting device of FIG. 1.

FIG. 11 is a view showing a light emitting module having the light emitting device of FIG. 4. The following description with reference to FIG. 11 will be made by making reference to the above described embodiment.

Referring to FIGS. 11 and 1, in the light emitting module, the light emitting device 100 may be disposed on a module substrate 400. One light emitting device 100 or a plurality of light emitting devices 100 may be disposed on the module substrate 400. The module substrate 400 may be bonded to the first to fourth lead frames 125, 135, 145, and 155 by bonding members 401, 402, and 403. The bonding members 401, 402, and 403 may include an adhesive material such as a solder.

The module substrate 400 may be a printed circuit board (PCB). For example, the module substrate 400 may include a PCB including a resin material, a PCB having a heat radiation layer (metal core PCB; MCPCB) formed of a metal material, or a flexible PCB, but the embodiment is not limited thereto.

Figure 12:
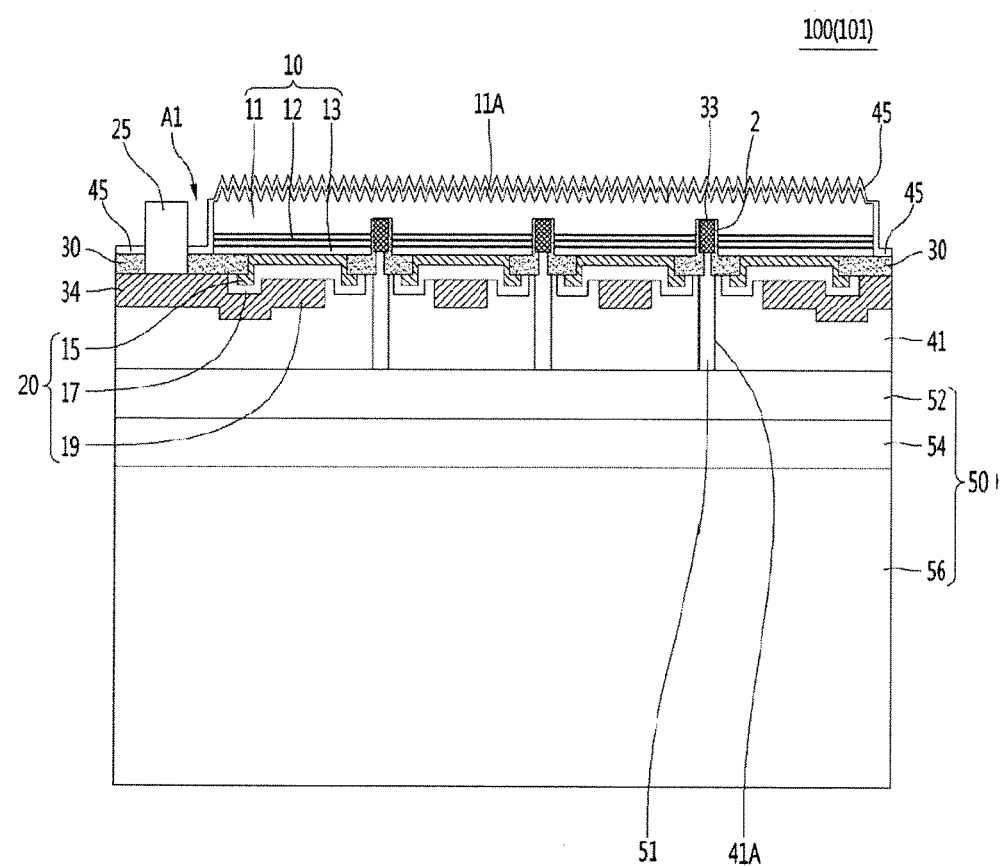
FIG. 12 is a view showing an example of a light emitting chip of a light emitting device according to the embodiment.

FIG. 12 is a view showing the light emitting chip of FIG. 1.

Referring to FIG. 12, the light emitting chips 100 and 101 may include a light emitting structure 10 having a plurality of semiconductor layers 11, 12, and 13, a first electrode layer 20 under the light emitting structure 10, a second electrode layer 50 under the first electrode layer 20, an insulating layer 41 between the first and second electrode layers 20 and 50, and a pad 25.

The light emitting structure 10 may include a first semiconductor layer 11, an active layer 12, and a second semiconductor layer 13. The active layer 12 may be disposed between the first semiconductor layer 11 and the second semiconductor layer 13. The active layer 12 may be disposed under the first semiconductor layer 11 and the second semiconductor layer 13 may be disposed under the active layer 12.

For example, the first semiconductor layer 11 may include an n type semiconductor layer doped with first conductive dopants, for example, n type dopants, and the second semiconductor layer 13 may include a p type semiconductor layer doped with second conductive dopants, for example, p type dopants. In addition, the first semiconductor layer 11 may be prepared as a p type semiconductor layer and the second semiconductor layer 13 may be prepared as an n type semiconductor layer.

For example, the first semiconductor layer 11 may include an n type semiconductor layer. The first semiconductor layer 11 may be implemented with a compound semiconductor. For example, the first semiconductor layer 11 may be implemented with at least one of a group II-VI compound semiconductor and a group III-V compound semiconductor.

In detail, the first semiconductor layer 11 may be implemented with a semiconductor material having a compositional formula of $In_xAl_yGa_{1-x-y}N$ ($0 \leq x \leq 1$, $0 \leq y \leq 1$, $0 \leq x+y \leq 1$). For example, the first semiconductor layer 11 may selectively include GaN, AlN, AlGaN, InGaN, InN, InAlGaN, AlInN, AlGaAs, GaP, GaAs, GaAsP, AlGaInP, or the like and may be doped with an n type dopant such as Si, Ge, Sn, Se, Te, or the like.

Electrons (or holes) injected through the first semiconductor layer 11 and holes (or electrons) injected through the second semiconductor layer 13 are combined in the active layer 12 so that the active layer 12 emits light corresponding to the energy band gap difference according to materials constituting the active layer 12. The active layer 12 may have one of a single quantum well structure, a multi-quantum well structure, a quantum dot structure, or a quantum wire structure, but the embodiment is not limited thereto.

The active layer 12 may be implemented with a compound semiconductor. For example, the active layer 12 may be implemented with at least one of group II-VI and group III-V compound semiconductors. For example, the active layer 12 may be implemented with a semiconductor material having a compositional formula of $In_xAl_yGa_{1-x-y}N$ ($0 \leq x \leq 1$, $0 \leq y \leq 1$, $0 \leq x+y \leq 1$). When the active layer 12 is implemented with the multi-quantum well structure, the active layer 12 may be formed by stacking a plurality of well layers and a plurality of barrier layers. For example, the active layer 12 may be implemented in a cycle of an InGaN well layer/GaN barrier layer, an InGaN well layer/AlGaN barrier layer, an InAlGaN well layer/InAlGaN barrier layer, or a GaN well layer/AlGaN barrier layer.

For example, the second semiconductor layer 13 may be implemented with a p type semiconductor layer. For example, the second semiconductor layer 13 may be implemented with a compound semiconductor. For example, the second semiconductor layer 13 may be implemented with at least one of a group II-VI compound semiconductor and a group III-V compound semiconductor.

For example, the second semiconductor layer 13 may be implemented with a semiconductor material having a compositional formula of $In_xAl_yGa_{1-x-y}N$ ($0 \leq x \leq 1$, $0 \leq y \leq 1$, $0 \leq x+y \leq 1$). For example, the second semiconductor layer 13 may selectively include GaN, AlN, AlGaN, InGaN, InN, InAlGaN, AlInN, AlGaAs, GaP, GaAs, GaAsP, AlGaInP, or the like and may be doped with p type dopants such as Mg, Zn, Ca, Sr, Ba, or the like.

Meanwhile, the first semiconductor layer 11 may include a p type semiconductor layer and the second semiconductor layer 13 may include an n type semiconductor layer. In addition, a semiconductor layer including an n type or a p type semiconductor layer having conductivity different from that of the second semiconductor layer 13 may be further provided under the second semiconductor layer 13. Thus, the light emitting structure 10 may have at least one of np, pn, npn, and pnp junction structures. In addition, impurities may be doped into the first semiconductor layer 11 and the second semiconductor layer 13 at uniform or non-uniform doping concentration. In other words, the structures of the light emitting structure 10 may be variously formed, and the embodiment is not limited thereto.

In addition, an InGaN/GaN superlattice structure or InGaN/InGaN superlattice structure, which is formed by alternatively arranging mutually different semiconductor layers, may be formed between the first semiconductor layer 11 and the active layer 12 or between the second semiconductor layer 13 and the active layer 12. In addition, an AlGaN layer doped with second conductive dopants may be formed between the second semiconductor layer 13 and the active layer 12.

A rough concavo-convex part 11A may be formed on a top surface of the first semiconductor layer 11. The concavo-convex surface 11A may improve light extraction efficiency. The side sectional surface of the concavo-convex surface 11A may have a polygonal shape or a hemispherical shape.

The first electrode layer 20 is disposed between the light emitting structure 10 and the second electrode layer 50, electrically connected with the second semiconductor layer 13 of the light emitting structure 10, and electrically connected with the second electrode layer 50. The first electrode layer 20 includes a first contact layer 15, a reflective layer 17, and a capping layer 19. The first contact layer 15 is disposed between the reflective layer 17 and the second semiconductor layer 13. The reflective layer 17 may be disposed between the first contact layer 15 and the capping layer 19. The first contact layer 15, the reflective layer 17, and the capping layer 19 may be formed of mutually different materials, but the embodiment is not limited thereto.

The first contact layer 15 may make contact with the second semiconductor layer 13. For example, the first contact layer 15 may make ohmic contact to the second semiconductor layer 13. For example, the first contact layer 15 may be formed of a conductive oxide film, a conductive nitride, or metal. For example, the first contact layer 15 may be formed of at least one of indium tin oxide (ITO), ITO nitride (ITON), indium zinc oxide (IZO), IZO nitride (IZON), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The reflective layer 17 may be electrically connected with the first contact layer 15 and the capping layer 19. The reflective layer 17 reflects light incident thereto from the light emitting structure 10 to increase the quantity of light to be extracted to the outside.

The reflective layer 17 may be formed of metal having a reflective index of at least 70%. For example, the reflective layer 17 may be formed of metal including at least one of Ag, Ni, Al, Rh, Pd, Ir, Ru, Mg, Zn, Pt, Cu, Au, and Hf or the alloy thereof. In addition, the reflective layer 17 may be formed in multiple layers by using the metal or the alloy and a transmissive conductive material such as indium-tin-oxide (ITO), indium-zinc-oxide (IZO), indium-zinc-tin-oxide (IZTO), indium-aluminum-zinc-oxide (IAZO), indium-gallium-zinc-oxide (IGZO), indium-gallium-tin-oxide (IGTO), aluminum-zinc-oxide (AZO), and antimony-tin-oxide (ATO). For example, according to the embodiment, the reflective layer 17 may include at least any one of Ag, Al, an Ag—Pd—Cu alloy, or an Ag—Cu alloy. For example, the reflective layer 17 may be formed by alternating an Ag layer and an Ni layer, or may include Ni/Ag/Ni, a Ti layer, or a Pt layer. Alternatively, the first contact layer 15 may be formed under the reflective layer 17 and a portion of the first contact layer 15 may make contact with the second semiconductor layer 13 through the reflective layer 17. Alternatively, the reflective layer 17 may be formed under the first contact layer 15 and a portion of the reflective layer 17 may make contact with the second semiconductor layer 13 through the first contact layer 15.

According to the embodiment, the light emitting chips 100 and 101 may include the capping layer 19 disposed under the reflective layer 17. The capping layer 19 makes contact with the bottom surface of the reflective layer 17 and serves as a wiring layer to transmit power fed from the pad 25 as a contact part 34 is connected with the pad 25. The capping layer 19 may be formed of metal. For example, the capping layer 19 may include at least one of materials such as Au, Cu, Ni, Ti, Ti—W, Cr, W, Pt, V, Fe, and Mo.

The contact part 34 of the capping layer 19 is disposed in a region which does not overlap with the light emitting structure 10 in the vertical direction, and overlaps with the pad 25 in the vertical direction. The contact part 34 of the capping layer 19 is disposed in a region that does not overlap with the first contact layer 15 and the reflective layer 17 in the vertical direction. The contact part 34 of the capping layer 19 may be disposed at a position lower than the light emitting structure 10 and may directly make contact with the pad 25.

The pad 25 may be formed in a single layer or in multiple layers. In the case of the single layer, the pad 25 may include Au. In the case of multiple layers, the pad 25 may include at least two of Ti, Ag, Cu, and Au. Herein, in the case of the multiple layers, the pad 25 may include a stack structure of Ti/Ag/Cu/Au or a stack structure of Ti/Cu/Au. At least one of the reflective layer 17 and the first contact layer 15 may directly make contact with the pad 25, but the embodiment is not limited thereto.

The pad 25 may be disposed in a region A1 between an outer sidewall of the first electrode layer 20 and the light emitting structure 10. The protective layer 30 and a transmissive layer 45 may make contact with the circumference of the pad 25. The pad 25 may overlap with the first and second electrode layers 20 and 50 in the vertical direction.

The protective layer 30 is disposed under a bottom surface of the light emitting structure 10. The protective layer 30 may make contact with a bottom surface of the second semiconductor layer 13 and the first contact layer 15 and may make contact with the reflective layer 17.

An inner portion, which overlaps with the light emitting structure 10 in the vertical direction, of the protective layer 30 may be disposed to overlap with a region of the protrusion part 16 in the vertical direction. An outer portion of the protective layer 30 is disposed to extend upward from the contact part 34 of the capping layer 19 and to overlap with the contact part 34 in the vertical direction. The outer portion of the protective layer 30 may make contact with the pad 25. In detail, the outer portion of the protective layer 30 may be disposed on a circumferential surface of the pad 25. The inner portion of the protective layer 30 may be disposed between the light emitting structure 10 and the first electrode layer 20, and the outer portion of the protective layer 30 may be disposed between the transmissive layer 45 and the contact part 34 of the capping layer 19. The outer portion of the protective layer 30 extends into the region A1 present at the outside of the sidewall of the light emitting structure 10, thereby preventing moisture from being infiltrated.

The protective layer 30 may be defined as a channel layer or an isolation layer. The protective layer 30 may be formed of a low refractive material. The protective layer 30 may be implemented with an insulating material. For example, the protective layer 30 may be implemented with an oxide or a nitride. For example, the protective layer 30 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. The protective layer 30 may be formed of a transparent material.

The light emitting chips 100 and 101 according to the embodiment may include the insulating layer 41 electrically isolating the first electrode layer 20 from the second electrode layer 50. The insulating layer 41 may be disposed between the first electrode layer 20 and the second electrode layer 50. An upper portion of the insulating layer 41 may make contact with the protective layer 30. The insulating layer 41 may be implemented with, for example, an oxide or a nitride. For example, the insulating layer 41 may be formed of at least one selected from the group consisting of $SiO_2$, $Si_xO_y$, $Si_3N_4$, $Si_xN_y$, $SiO_xN_y$, $Al_2O_3$, $TiO_2$, and AlN.

For example, the insulating layer 41 may be formed with a thickness in the range of 100 nm to 2000 nm. If the insulating layer 41 is formed with the thickness of less than 100 nm, a problem may be caused in the insulating property of the insulating layer 41. If the insulating layer 41 is formed with the thickness of more than 2,000 nm, the insulating layer 41 may be broken in the subsequent process step. The insulating layer 41 may make contact with a bottom surface of the first electrode layer 20 and a top surface of the second electrode layer 50. The insulating layer 41 may be formed with a thickness thicker than that of each of the protective layer 30, the capping layer 19, the contact layer 15, and the reflective layer 17.

The second electrode layer 50 may include a diffusion blocking layer 52 disposed under the insulating layer 41, a bonding layer 54 disposed under the diffusion blocking layer 52, and a conductive support member 56 disposed under the bonding layer 54. The second electrode layer 50 may be electrically connected with the first semiconductor layer 11. In addition, the second electrode layer 50 may selectively include one or two of the diffusion blocking layer 52, the bonding layer 54, and the conductive support member 56, and at least one of the diffusion blocking layer 52 or the bonding layer 54 may not be formed.

The diffusion blocking layer 52 may include at least one of materials such as Cu, Ni, Ti, Ti—W, Cr, W, Pt, V, Fe, and Mo. The diffusion blocking layer 52 may serve as a diffusion-barrier layer between the insulating layer 41 and the bonding layer 54. The diffusion blocking layer 52 may be electrically connected with the bonding layer 54 and the conductive support member 56, and may be electrically connected with the first semiconductor layer 11.

The diffusion blocking layer 52 may perform a function of preventing a material included in the bonding layer 54 from being diffused toward the reflective layer 17 in the process that the bonding layer 54 is provided. The diffusion blocking layer 52 may prevent a material, such as tin (Sn), included in the bonding layer 54 from affecting the reflective layer 17.

The bonding layer 54 may include barrier metal or bonding metal. For example, the bonding layer 54 may include at least one of Ti, Au, Sn, Ni, Cr, Ga, In, Bi, Cu, Ag, Nb, Pd, or Ta. The conductive support member 56 may support the light emitting structure 10 while performing a hat radiation function according to the embodiment. The bonding layer 54 may include a seed layer.

The conductive support member 56 may include at least one of a metal substrate or a carrier substrate including, for example, Ti, Cr, Ni, Al, Pt, Au, W, Cu, Mo, Cu—W, or a semiconductor substrate (e.g., Si, Ge, GaN, GaAs, ZnO, SiC, or SiGe) including impurities. The conductive support member 56, which is a layer to support the light emitting device 100, may have the thickness of at least 80% of the thickness of the second electrode layer 50, in detail, at least 30 μm.

Meanwhile, the second contact layer 33 is disposed inside the first semiconductor layer 11 to make contact with the first semiconductor layer 11. A top surface of the second contact layer 33 may be disposed above a bottom surface of the first semiconductor layer 11. The second contact layer 33 is electrically connected with the first semiconductor layer 11 and insulated from the active layer 12 and the second semiconductor layer 13.

The second contact layer 33 may be electrically connected with the second electrode layer 50. The second contact layer 33 may be disposed such that the second contact layer 33 passes through the first electrode layer 20, the active layer 12, and the second semiconductor layer 15. The second contact layer 33 is disposed in a recess 2 disposed in the light emitting structure 10 and insulated from the active layer 12 and the second semiconductor layer 15 by the protective layer 30. A plurality of second contact layers 33 may be disposed to be spaced apart from each other.

The second contact layer 33 may be connected with a protrusion 51 of the second electrode 50. The protrusion 51 may protrude from the diffusion blocking layer 52. The protrusion 51 may pass through a hole 41A disposed in the insulating layer 41 and the protective layer 30 and may be insulated from the first electrode layer 20.

For example, the second contact layer 33 may include at least one of Cr, V, W, Ti, Zn, Ni, Cu, Al, Au, and Mo. Alternatively, the protrusion 501 may include at least one of materials constituting the diffusion blocking layer 52 and the bonding layer 54, but the embodiment is not limited thereto. For example, the protrusion 51 may include at least one of Ti, Au, Sn, Ni, Cr, Ga, In, Bi, Cu, Ag, Nb, Pd, or Ta.

The pad 25 may be electrically connected with the first electrode layer 20 and may be exposed to the region A1 present at the outside of the sidewall of the light emitting structure 10. One pad 25 or a plurality of pads 25 may be disposed. The pad 25 may include at least one of materials such as Cu, Ni, Ti, Ti—W, Cr, W, Pt, V, Fe, and Mo.

The transmissive layer 45 may protect the surface of the light emitting structure 10 and may insulate the pad 25 from the light emitting structure 10. The transmissive layer 45 may make contact with a peripheral portion of the protective layer 30. The transmissive layer 45 may have a refractive index lower than that of a material of a semiconductor layer constituting the light emitting structure 10, thereby improving light extraction efficiency. The insulating layer 45 may be implemented with, for example, an oxide or a nitride. For example, the transmissive layer 45 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. Meanwhile, the transmissive layer 45 may be omitted according to designs. According to the embodiment, the light emitting structure 10 may be driven by the first electrode layer 20 and the second electrode layer 50.

That is, regarding the light emitting chip according to the embodiment, a plurality of light emitting structures individually driven may be included in one chip. According to the embodiment, although the above described has been made in that two light emitting structures are disposed in one light emitting chip, at least three light emitting structures may be implemented to be disposed in one light emitting chip and to be individually driven. For example, the light emitting chip having such a structure and the light emitting device having the same may be usefully applied to a lighting device, such as a headlight or a tail light, of a vehicle.

Additionally, in the light emitting device according to the embodiment, a phosphor film (not shown) may be provided on the light emitting structure 10.

Although the exemplary embodiments of the present disclosure have been described, it is apparently understood that the present disclosure should not be limited to these exemplary embodiments but various changes and modifications can be made by one ordinary skilled in the art within the spirit and scope of the present disclosure as hereinafter claimed. Accordingly, the technical scope of the present disclosure should not be limited to the detailed description of the invention, but defined within the scope of following claims.

INDUSTRIAL APPLICABILITY

The embodiment may improve the reliability of the light emitting device.

The embodiment may be applicable for a lighting device such as various lighting lamps, a signal lamp, a headlamp for a vehicle, or an electronic display.

The invention claimed is:
1. A light emitting device comprising:
a body having a cavity;
first and second lead frames disposed in the cavity;
a third lead frame disposed in the cavity and disposed between the first and second lead frames;
a fourth lead frame disposed in the cavity, disposed between the first and second lead frames, and spaced apart from the third lead frame;
a first light emitting chip disposed on the first lead frame; and
a second light emitting chip disposed on the second lead frame,
wherein the body includes: first and second lateral sides disposed in opposition to each other; and third and fourth lateral sides disposed in opposition to each other,
wherein the first lead frame includes a first lead part protruding through the first lateral side of the body and a second lead part protruding through the second lateral side of the body,
wherein the second lead frame includes a third lead part protruding through the first lateral side of the body and a fourth lead part protruding through the second lateral side of the body,
wherein the third lead frame includes a fifth lead part protruding through the first lateral side of the body,
wherein the fourth lead frame includes a sixth lead part protruding through the second lateral side of the body,
wherein top surfaces of the first, second, third and fourth lead frames are disposed on a bottom of the cavity,
wherein respective bottom surfaces of each of the first, second, third and fourth lead frames are exposed to a bottom of the body,
wherein, in the body, the first and second lateral sides have respective lengths longer than respective lengths of the third and fourth lateral sides,
wherein the fifth lead part of the third lead frame is disposed between the first lead part of the first lead frame and the third lead part of the second lead frame,
wherein the sixth lead part of the fourth lead frame is disposed between the second lead part of the first lead frame and the fourth lead part of the second lead frame,
wherein the first light emitting chip is electrically connected with the first and third lead frames, wherein the second light emitting chip is electrically connected with the second and fourth lead frames, and wherein the first and second light emitting chips are individually driven.

2. The light emitting device of claim 1, further comprising:
a first connection member connected with the first light emitting chip and the third lead frame;
a second connection member connected with the second light emitting chip and the fourth lead frame;
a first protective chip disposed on the third lead frame; and
a third connection member connected with the first protective chip and the first lead frame.

3. The light emitting device of claim 2, further comprising:
a second protective chip disposed on the fourth lead frame; and
a fourth connection member connected with the second protective chip and the second lead frame.

4. The light emitting device of claim 3, further comprising:
a protrusion part disposed in the cavity of the body and protruding from the body toward a top portion of the cavity at a region between the third and fourth lead frames,
wherein an upper portion of the protrusion part is provided over top surfaces of the third and fourth lead frames,
wherein the protrusion part is formed of a material of the body, and
wherein the protrusion part is disposed between the first light emitting chip and the second light emitting chip.

5. The light emitting device of claim 4, wherein the body includes a spacer part disposed in respective regions between the first lead frame and the third and fourth lead frames and respective regions between the second lead frame and the third and fourth lead frames,
wherein the spacer part includes:
a first spacer part disposed in a region between the first lead frame and the third and fourth lead frames; and
a second spacer part disposed in a region between the second lead frame and the third and fourth lead frames,
wherein the protrusion part is disposed in a region between the first and second spacer parts,
wherein the cavity includes a first wall adjacent to the first lateral side of the body and a second wall adjacent to the second lateral side of the body, and
wherein the first wall adjacent to the first lateral side of the body and the second wall adjacent to the second lateral side of the body have a curved surface corresponding to the protrusion part.

6. The light emitting device of claim 5, wherein the first and second spacer parts include first and second reflective parts protruding upward higher than respective top surfaces of each of the first to fourth lead frames.

7. The light emitting device of claim 1, wherein respective outer regions of each of the first to fourth lead frames have respective stepped structures coupled to portions of the body.

8. The light emitting device of claim 7, wherein the first lead frame includes a plurality of holes disposed adjacent to the first and second lateral sides of the body and having stepped structures,
wherein the second lead frame includes a plurality of holes disposed adjacent to the first and second lateral sides of the body and having stepped structures,
wherein a distance between the plurality of holes of the first lead frame is wider than a width of the first light emitting chip,
wherein a distance between the plurality of holes of the second lead frame is wider than a width of the second light emitting chip, and
wherein the plurality of holes of the first lead frame and the plurality of holes of the second lead frame are coupled to the body.

9. The light emitting device of claim 1, wherein the respective lengths of the first and second lateral sides of the body range from 1.3 times to 2 times the respective lengths of the third and fourth lateral sides of the body,
wherein the body includes a protrusion part disposed in the cavity,
wherein the protrusion part is protruded toward a top portion of the cavity from a region between the third and fourth lead frames,
wherein the cavity includes a first wall adjacent to the first lateral side of the body and a second wall adjacent to the second lateral side of the body, and
wherein the first wall adjacent to the first lateral side of the body and the second wall adjacent to the second lateral side of the body have a curved surface corresponding to a rounded surface of the protrusion part.

10. The light emitting device of claim 1, further comprising:
a first phosphor film disposed on the first light emitting chip;
a second phosphor film disposed on the second light emitting chip; and
a molding member in the cavity.

11. The light emitting device of claim 1, wherein the first to fourth lead frames each have bottom surfaces disposed on a same horizontal plane as the bottom of the body.

12. The light emitting device of claim 1, wherein each of the first to fourth lead frames has a bottom surface having a width smaller than a width of a respective top surface of each of the first to fourth lead frames.

13. A light emitting device comprising:
a body having a cavity;
first and second lead frames disposed in the cavity;
third and fourth lead frames disposed in the cavity and arranged in line with each other between the first and second lead frames;
a first light emitting chip disposed on the first lead frame;
a second light emitting chip disposed on the second lead frame;
a first protective chip disposed on the third lead frame; and
a second protective chip disposed on the fourth lead frame,
wherein each of the first and second lead frames includes a plurality of lead parts protruding through first and second lateral sides of the body,
wherein each of the third and fourth lead frames includes a lead part protruding through the first or second lateral side of the body,
wherein the lead part of the third lead frame protrudes in a direction opposite to a direction that the lead part of the fourth lead frame protrudes,
wherein the body includes third and fourth lateral sides of the body having a smaller length than a length of the first and second lateral sides of the body,
wherein the respective length of the first and second lateral sides of the body is a length in a first direction of the body, wherein the respective length of the third and fourth lateral sides of the body is a length in a second direction of the body, wherein the first and second lateral sides of the body are disposed in opposition to each other, and the third and fourth lateral sides of the body are disposed in opposition to each other, wherein top surfaces of the first, second, third and fourth lead frames are disposed on a bottom of the cavity, and wherein respective bottom surfaces of each of the first, second, third and fourth lead frames are exposed to a bottom of the body.

14. The light emitting device of claim 13, wherein the lead part of the third lead frame is disposed between the lead part of the plurality of lead parts of the first lead frame and the lead part of the plurality of lead parts of the second lead frame at the first lateral side of the body.

15. The light emitting device of claim 14, wherein the lead part of the fourth lead frame is disposed between the lead part of the plurality of lead parts of the first lead frame and the lead part of the plurality of lead parts of the second lead frame at the second lateral side of the body.

16. The light emitting device of claim 15, wherein the first, second, and third lead frames are disposed in parallel to each other between the third and fourth lateral sides of the body in the second direction.

17. The light emitting device of claim 16, further comprising:
   a first phosphor film disposed on the first light emitting chip;
   a second phosphor film disposed on the second light emitting chip; and
   a molding member in the cavity,
   wherein the first light emitting chip is electrically connected with the first and third lead frames,
   wherein the second light emitting chip is electrically connected with the second and fourth lead frames,
   wherein the first and second light emitting chips are individually driven, and
   wherein the first and second phosphors films have mutually different phosphors.

* * * * *